United States Patent
Bae et al.

(10) Patent No.: US 9,146,433 B2
(45) Date of Patent: Sep. 29, 2015

(54) DISPLAY DEVICE AND METHOD OF MANUFACTURING THE SAME

(71) Applicant: Samsung Display Co., Ltd., Yongin, Gyeonggi-Do (KR)

(72) Inventors: Joo-Han Bae, Seongnam-si (KR); Seonggyu Kwon, Suwon-si (KR); Donghyun Yu, Gwacheon-si (KR); Hyung-Il Jeon, Incheon (KR)

(73) Assignee: SAMSUNG DISPLAY CO., LTD. (KR)

( * ) Notice: Subject to any disclaimer, the term of this patent is extended or adjusted under 35 U.S.C. 154(b) by 4 days.

(21) Appl. No.: 14/108,103

(22) Filed: Dec. 16, 2013

(65) Prior Publication Data

US 2014/0375920 A1    Dec. 25, 2014

(30) Foreign Application Priority Data

Jun. 25, 2013    (KR) .................. 10-2013-0073239

(51) Int. Cl.
*G02F 1/1343* (2006.01)
*G02F 1/1362* (2006.01)
*H01L 29/66* (2006.01)
*G02F 1/1333* (2006.01)

(52) U.S. Cl.
CPC .... *G02F 1/136259* (2013.01); *H01L 29/66742* (2013.01); *G02F 1/133377* (2013.01); *G02F 2001/136268* (2013.01)

(58) Field of Classification Search
USPC ................................... 349/141, 156
See application file for complete search history.

(56) References Cited

U.S. PATENT DOCUMENTS

| | | | | |
|---|---|---|---|---|
| 5,121,236 A | * | 6/1992 | Ukai et al. | ............ 349/55 |
| 7,948,568 B2 | | 5/2011 | Park et al. | |
| 2008/0129901 A1 | * | 6/2008 | You et al. | ............ 349/33 |
| 2011/0122114 A1 | | 5/2011 | Tanaka et al. | |

FOREIGN PATENT DOCUMENTS

| | | |
|---|---|---|
| KR | 10-2000-0009914 A | 2/2000 |
| KR | 10-2008-0000313 A | 1/2008 |
| KR | 10-2008-0062544 A | 7/2008 |
| KR | 10-2008-0091976 A | 10/2008 |
| KR | 10-2012-0026880 A | 3/2012 |
| KR | 1020140025739 | 3/2014 |

* cited by examiner

*Primary Examiner* — Lucy Chien
(74) *Attorney, Agent, or Firm* — Innovation Counsel LLP

(57) ABSTRACT

A display device includes a substrate, gate lines extended in a first direction on the substrate, data lines extended in a second direction substantially perpendicular to the first direction on the substrate, and pixels connected to the gate and data lines. Each pixel includes a transistor having one end connected to a data line, and a gate electrode connected to a corresponding gate line, a liquid crystal layer disposed in a tunnel-shaped cavity, first and second electrodes for applying an electric field to the liquid crystal layer. The first electrode of each pixel is connected to another end of the transistor, a second electrode of each pixel overlaps the first electrode of one of its adjacent pixels, and the first electrode of each pixel overlaps a second electrode of another one of its adjacent pixels.

14 Claims, 32 Drawing Sheets

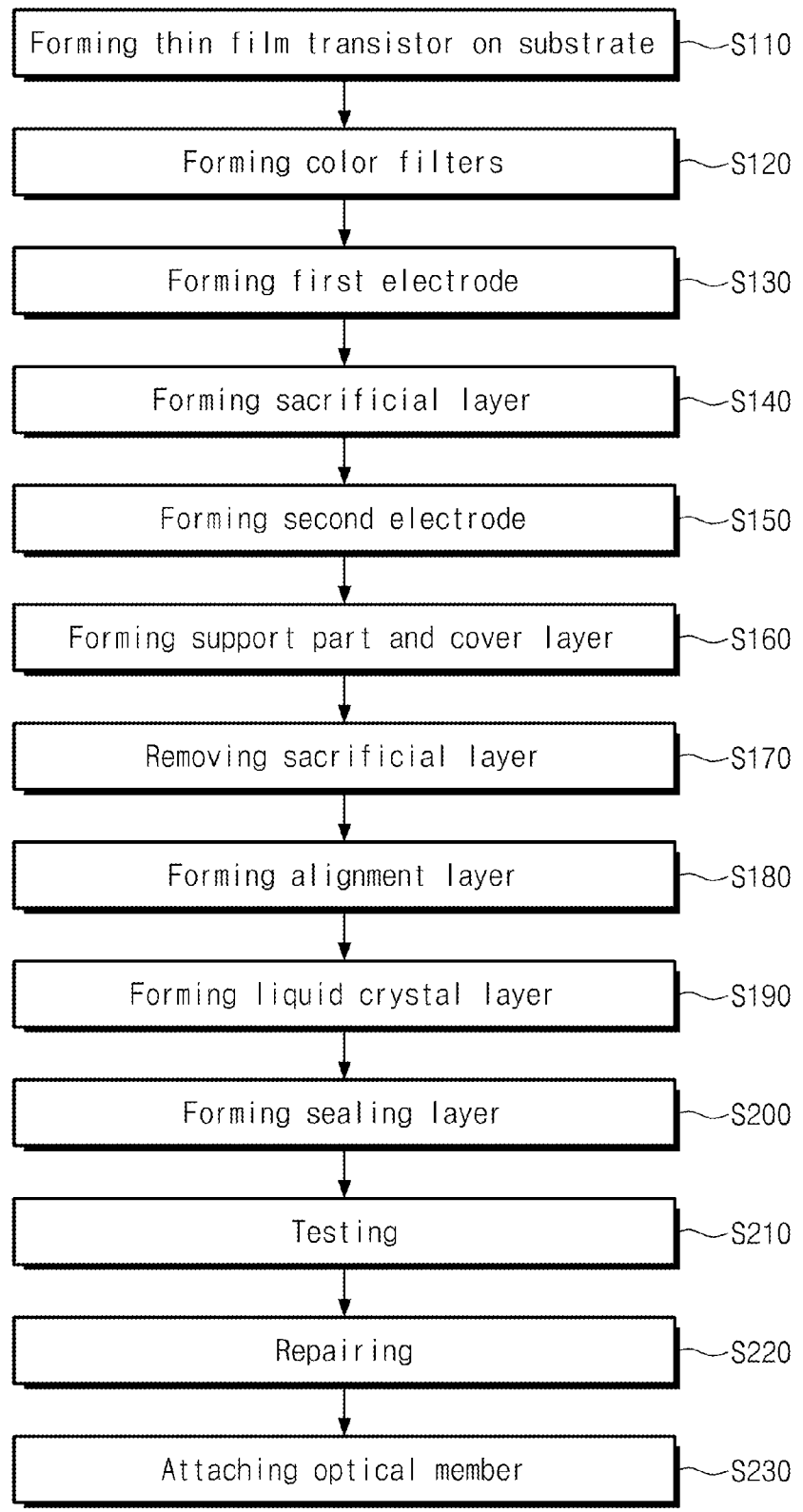

DISPLAY DEVICE AND METHOD OF MANUFACTURING THE SAME

CROSS-REFERENCE TO RELATED APPLICATION

This U.S. non-provisional patent application claims priority under 35 U.S.C. §119 to Korean Patent Application No. 10-2013-0073239, filed on Jun. 25, 2013, the contents of which are hereby incorporated by reference.

BACKGROUND

1. Field of Disclosure

The present disclosure relates generally to flat panel displays. More specifically, the present disclosure relates to defect repair in a display device.

2. Description of the Related Art

In recent years, various different types of display devices, such as liquid crystal display devices, electrophoretic display devices, etc., have been developed to replace cathode ray tubes.

One example of a recent display device includes two substrates facing each other with an image display layer, e.g., a liquid crystal layer, an electrophoretic layer, etc., disposed between the two substrates. The two substrates face each other while being coupled to each other, and are spaced apart from each other by a predetermined distance such that the image display layer is disposed between the two substrates.

In order to manufacture the display device, a spacer used to maintain the distance between the two substrates is formed on one of the substrates, and the other substrate is attached to the spacer using an adhesive. However, the resulting manufacturing process is complicated and expensive.

SUMMARY

The present disclosure provides a display device having improved display quality and simpler manufacture.

The present disclosure also provides a method of manufacturing the display device.

Embodiments of the inventive concept provide a display device including a substrate, a plurality of gate lines disposed on the substrate and extended at least approximately in a first direction, a plurality of data lines disposed on the substrate and extended at least approximately in a second direction substantially perpendicular to the first direction, and a plurality of pixels each being connected to a corresponding gate line of the gate lines and a corresponding data line of the data lines. Each of the pixels includes a transistor having one end connected to one of the data lines, and a gate electrode connected to one of the gate lines, a cover layer which at least partially defines a tunnel-shaped cavity on the substrate, a liquid crystal layer disposed in the tunnel-shaped cavity, and a first electrode and a second electrode configured to apply an electric field to the liquid crystal layer. The first electrode of each pixel is connected to another end of its corresponding transistor, the second electrode of a predetermined one of the pixels overlaps the first electrode of a respective first adjacent pixel, and the first electrode of the predetermined one of the pixels overlaps the second electrode of a respective second adjacent pixel.

The first adjacent pixel, the predetermined one of the pixels, and the second adjacent pixel can be sequentially arranged in the second direction.

When the transistor of the predetermined one of the pixels is determined to be defective, the second electrode of the predetermined one of the pixels can be configured to be electrically connected to the first electrode of the first adjacent pixel, and the first electrode of the predetermined one of the pixels can be configured to be electrically connected to the second electrode of the second adjacent pixel.

The second electrode of each of the pixels can be configured to be connected to a common voltage line so as to receive a common voltage.

When the transistor of the predetermined one of the pixels is determined to be defective, the another end of the transistor of the predetermined one of the pixels can be configured to be electrically disconnected from the first electrode of the predetermined pixel by a cutting operation.

Each of the pixels includes a display area and a non-display area, and when the transistor of the predetermined one of the pixels is detected to be defective, the second electrode of the predetermined one of the pixels can be configured to be cut along the first direction in the non-display area.

The first electrode of the predetermined one of the pixels can be configured to be electrically disconnected from the other end of the transistor of the predetermined one of the pixels by irradiating a laser beam onto a portion of the first electrode of the predetermined pixel that lies within the non-display area.

A length of the second electrode of each of the pixels along the second direction and in the non-display area can be shorter than a length of the second electrode of each of the pixels along the second direction and in the display area.

The display device can further include a cover layer at least partially defining the tunnel-shaped cavity on the substrate, and a sealing layer sealing the tunnel-shaped cavity.

Embodiments of the inventive concept provide a method of manufacturing a display device, including forming a transistor and a first electrode in a first pixel area of a base substrate, forming a sacrificial layer on the base substrate where the sacrificial layer extends in a first direction, forming a second electrode in the first pixel area and on the sacrificial layer, etching the sacrificial layer to form a tunnel-shaped cavity between the first electrode and the second electrode, forming an image display part in the tunnel-shaped cavity, and forming a sealing layer to seal the tunnel-shaped cavity. The second electrode overlaps another first electrode formed in a second pixel area adjacent to the first pixel area, and the first electrode of the first pixel area overlaps another second electrode formed in a third pixel area adjacent to the first pixel area.

The method can further comprise testing the transistor, which in turn can include repairing the transistor by electrically connecting the second electrode of the first pixel area to the first electrode of the second pixel area, and electrically connecting the first electrode of the first pixel area to the second electrode of the third pixel area when the transistor is determined to be defective.

The first, second, and third pixel areas can be sequentially arranged along a second direction.

Each of the pixel areas can have one of the second electrodes, and the second electrode of each of the pixel areas can extend substantially in the first direction to be connected to a common voltage line.

The repairing the defective transistor can include electrically disconnecting an end of the transistor from the first electrode of the first pixel area when the transistor is determined to be defective.

According to the above, a coupling process used to couple two substrates is omitted in a manufacturing process of the display device. In addition, an amount of liquid crystal in the liquid crystal layer and an amount of substrate are reduced. Thus, manufacturing time and cost of the display device are reduced.

Further, although defects occur in the pixels, the liquid crystal capacitor in a defective pixel is connected to its adjacent pixels, thereby preventing the defective pixels from being perceived. Therefore, display quality of the display device is improved.

BRIEF DESCRIPTION OF THE DRAWINGS

The above and other advantages of the present disclosure will become readily apparent by reference to the following detailed description when considered in conjunction with the accompanying drawings wherein:

FIG. 6 is a flowchart showing a method of manufacturing the display device according to an exemplary embodiment of the present disclosure;

FIGS. 7A to 11A are plan views showing part of a manufacturing method for a display device according to an exemplary embodiment of the present disclosure;

FIGS. 7B to 11B are cross-sectional views taken along lines I-I' of FIGS. 7A to 11A, respectively;

FIGS. 12A to 19A and FIGS. 12B to 19B are cross-sectional views showing a remaining part of the manufacturing method for a display device according to an exemplary embodiment of the present disclosure;

FIGS. 21A to 23A, FIGS. 21B to 23B and FIG. 21C to FIG. 22C are cross-sectional views showing a remaining part of the manufacturing method for a display device according to an exemplary embodiment of the present disclosure.

DETAILED DESCRIPTION

Figure 1:
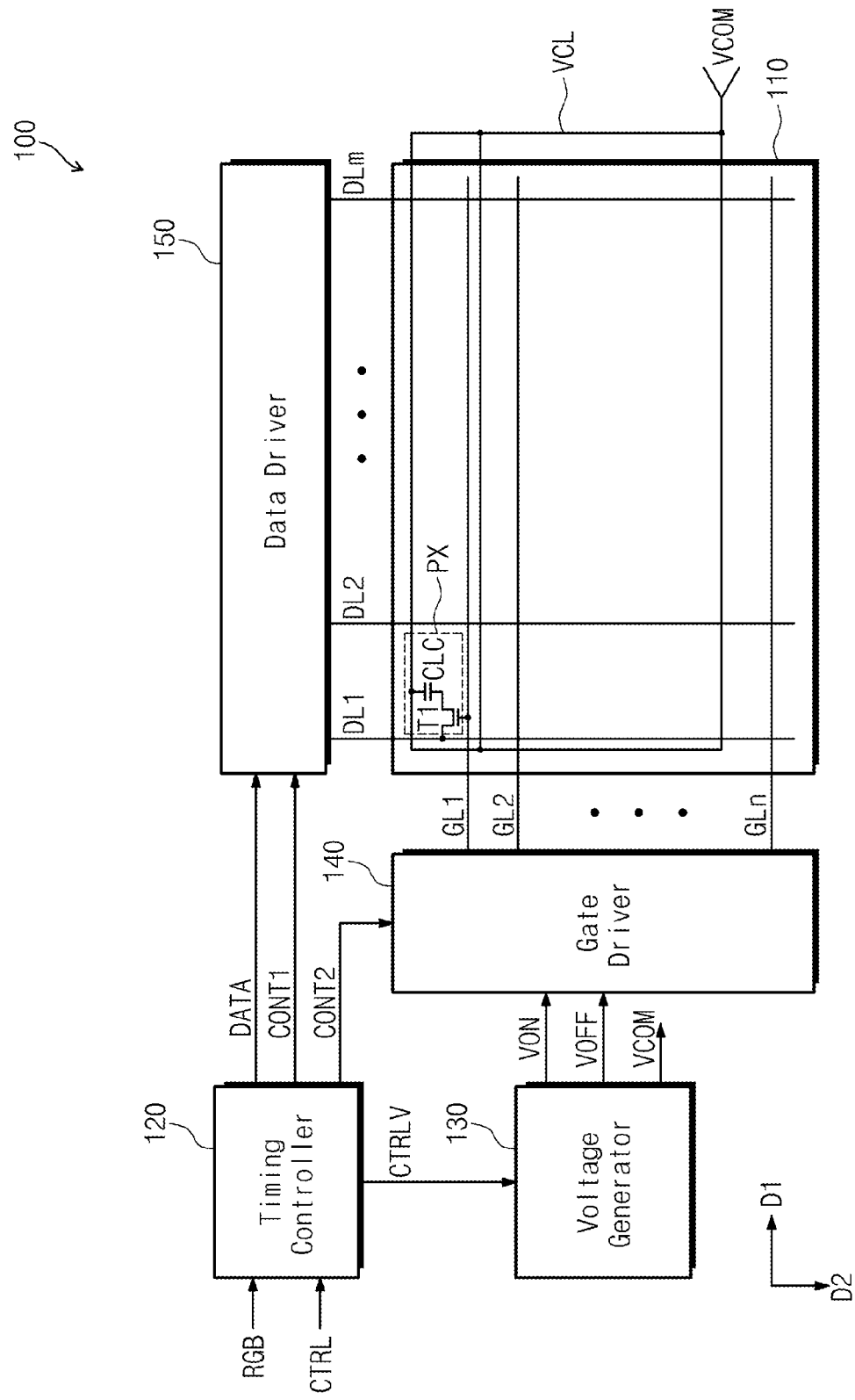
FIG. 1 is a block diagram showing a display device according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings, which are not necessarily to scale.

FIG. 1 is a block diagram showing a display device according to an exemplary embodiment of the present disclosure.

Referring to FIG. 1, a display device 100 includes a display panel 110, a timing controller 120, a voltage generator 130, a gate driver 140, and a data driver 150.

The display panel 110 includes a plurality of gate lines GL to GLn extended in a first direction D1, a plurality of data lines DL1 to DLm crossing the gate lines GL1 to GLn and extended in a second direction D2, and a plurality of pixels PX arranged in a matrix configuration in areas defined by the gate lines GL1 to GLn and the data lines DL1 to DLm. The gate lines GL to GLn are insulated from the data lines DL1 to DLm. Each of the pixels PX includes a switching transistor T1 connected to a corresponding gate line of the gate lines GL1 to GLn and a corresponding data line of the data lines DL1 to DLm, and also includes a liquid crystal capacitor CLC connected to the switching transistor T1.

The timing controller 120 receives an image signal RGB and control signals CTRL, such as a vertical synchronization signal, a horizontal synchronization signal, a main clock signal, and a data enable signal, etc., to control a display of the image signal RGB received from an external source. The timing controller 120 converts a data format of the image signal RGB to a data format appropriate to the particular driving conditions of the display panel 110. Based on the control signals CTRL, the timing controller 120 produces a data signal DATA, applies the data signal DATA and a first control signal CONT1 to the data driver 150, and applies a second control signal CONT2 to the gate driver 140. The first control signal CONT1 includes a horizontal synchronization start signal, a clock signal, and a line latch signal, and the second control signal CONT2 includes a vertical synchronization start signal and an output enable signal. The timing controller 120 also applies a voltage control signal CTRLV to the voltage generator 130 to control an operation of the voltage generator 130.

The voltage generator 130 generates a gate-on voltage VON, a gate-off voltage VOFF, and a common voltage VCOM in response to the voltage control signal CTRLV from the timing controller 120.

The gate driver 140 drives the gate lines GL to GLn in response to the second control signal CONT2 from the timing controller 120, and the gate-on voltage VON and the gate-off voltage VOFF from the voltage generator 130.

The data driver 150 outputs gray-scale voltages to drive the data lines DL1 to DLm in response to both the data signal DATA and the first control signal CONT1.

When a gate driving signal having the same voltage level as that of the gate-on voltage VON is applied to one gate line of the gate lines GL1 to GLn, the switching transistor T1 connected to the one gate line is turned on and the gray-scale voltages from the appropriate data line DL1 to DLm are applied to the pixels PX connected to the one gate line, to thereby display the image.

Figure 2:
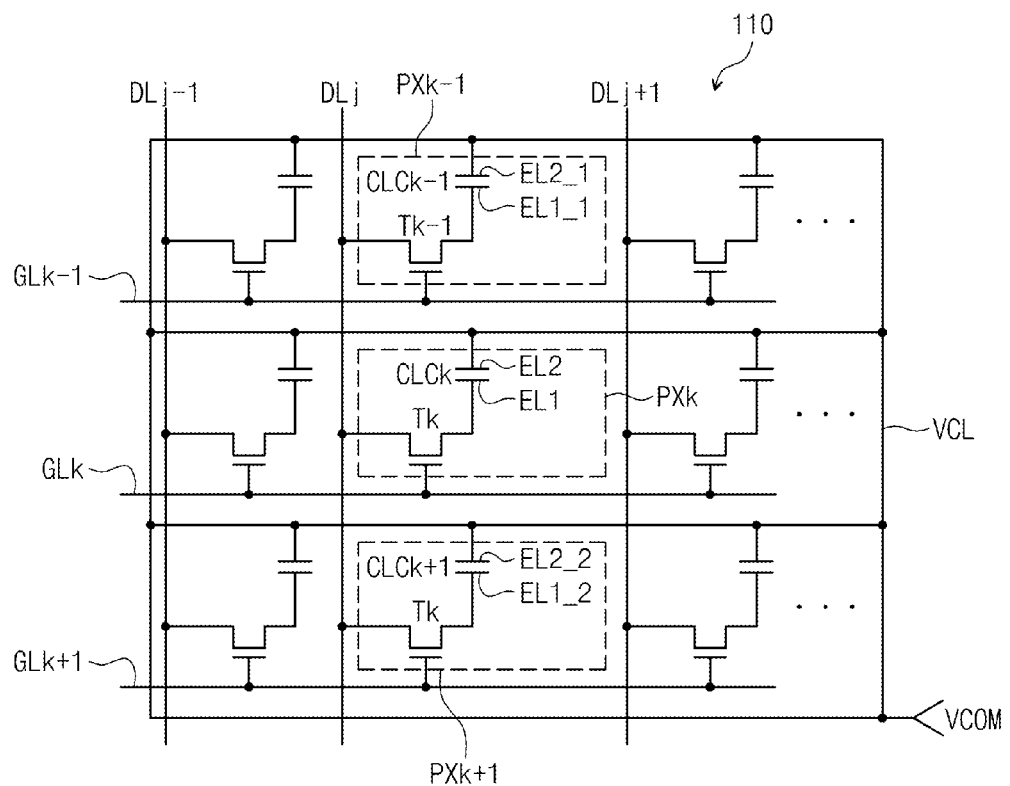
FIG. 2 is a circuit diagram showing a connection between pixels disposed in a display panel of FIG. 1.

FIG. 2 is a circuit diagram showing a connection between pixels disposed in the display panel of FIG. 1.

As an example, three pixels PXk−1, PXk, and PXk+1 of the display panel 110 are sequentially arranged in the second direction D2 as shown in FIG. 2. Each of the pixels PXk−1, PXk, and PXk+1 includes one thin film transistor and one liquid crystal capacitor. Hereinafter, the pixel PXk−1 will be referred to as a first adjacent pixel and the pixel PXk+1 will be referred to as a second adjacent pixel, each with reference to the pixel PXk.

The first adjacent pixel PXk−1 includes a thin film transistor Tk−1 and a liquid crystal capacitor CLCk−1, pixel PKx includes a thin film transistor Tk and a liquid crystal capacitor CLCk, and the second adjacent pixel PXk+1 includes a thin film transistor Tk+1 and a liquid crystal capacitor CLCk+1. Each of the liquid crystal capacitors CLCk−1, CLCk, and CLCk+1 includes a first electrode and a second electrode.

One end of the thin film transistor Tk−1 in the first adjacent pixel PXk−1 is connected to a corresponding data line DLj, the other end of the thin film transistor Tk−1 in the first adjacent pixel PXk−1 is connected to a first electrode EL1-1 of the liquid crystal capacitor CLCk−1, and a gate electrode of the thin film transistor Tk−1 is connected to a corresponding gate line GLk−1. A second electrode EL2_1 of the liquid crystal capacitor CLCk−1 receives the common voltage VCOM applied through a common voltage line VCL.

One end of the thin film transistor Tk in the pixel PXk is connected to a corresponding data line DLj, the other end of the thin film transistor Tk in the pixel PXk is connected to a first electrode EL1 of the liquid crystal capacitor CLCk, and a gate electrode of the thin film transistor Tk is connected to a corresponding gate line GLk. A second electrode EL2 of the liquid crystal capacitor CLCk receives the common voltage VCOM applied through the common voltage line VCL.

One end of the thin film transistor Tk+1 in the second adjacent pixel PXk+1 is connected to a corresponding data line DLj, the other end of the thin film transistor Tk+1 in the second adjacent pixel PXk+1 is connected to a first electrode EL1-2 of the liquid crystal capacitor CLCk+1, and a gate electrode of the thin film transistor Tk+1 is connected to a corresponding gate line GLk+1. A second electrode EL2_2 of the liquid crystal capacitor CLCk+1 receives the common voltage VCOM applied through the common voltage line VCL.

When the thin film transistor Tk of the pixel PXk is damaged during manufacturing of the display panel 110 having the above-stated structure, an on/off function of the thin film transistor Tk can no longer be performed normally. In this case, the liquid crystal capacitor CLCk often displays a black image or a white image instead of a desired image, and defects occurring on the display panel may be perceived by a user.

Figure 3:
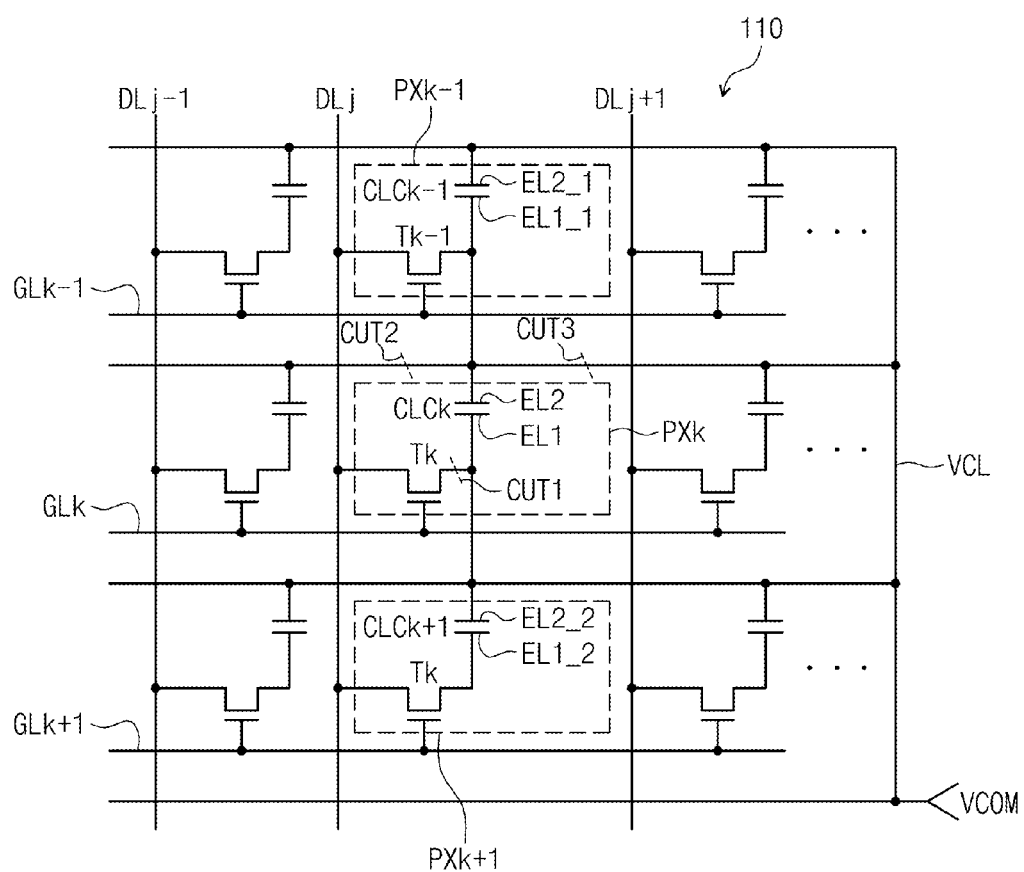
FIG. 3 is a circuit diagram showing a connection between the pixels disposed in the display panel of FIG. 1 after pixels on which a defect occurs are repaired.

FIG. 3 is a circuit diagram showing a connection between the pixels disposed in the display panel of FIG. 1 after pixels on which a defect occurs are repaired.

Referring to FIG. 3, when defects in the thin film transistor Tk of the pixel PXk are detected, the liquid crystal capacitor CLCk is electrically connected to adjacent pixels. That is, the first electrode EL1 of the liquid crystal capacitor CLCk in the pixel PXk is disconnected from the thin film transistor Tk, and the first electrode EL1 of the liquid crystal capacitor CLCk is connected to the second electrode EL2_2 of the liquid crystal capacitor CLCk+1 in the second adjacent pixel PXk+1. In addition, the second electrode EL2 of the liquid crystal capacitor CLCk in the pixel PXk is disconnected from the common voltage line VCL, and the second electrode EL2 of the liquid crystal capacitor CLCk is electrically connected to the first electrode EL1_1 of the liquid crystal capacitor CLCk−1 in the first adjacent pixel PXk−1. Thus, the pixel PXk including the liquid crystal capacitor CLCk displays the same image as that of the first adjacent pixel PXk-L in response to the turning-on or turning-off of the thin film transistor Tk−1 in the first adjacent pixel PXk−1. Since the pixel PXk in which the defects occur is repaired and displays the same image as that of the first adjacent pixel PXk−1, the defects perceived by the user on the display panel 110 may be reduced.

Figure 4:
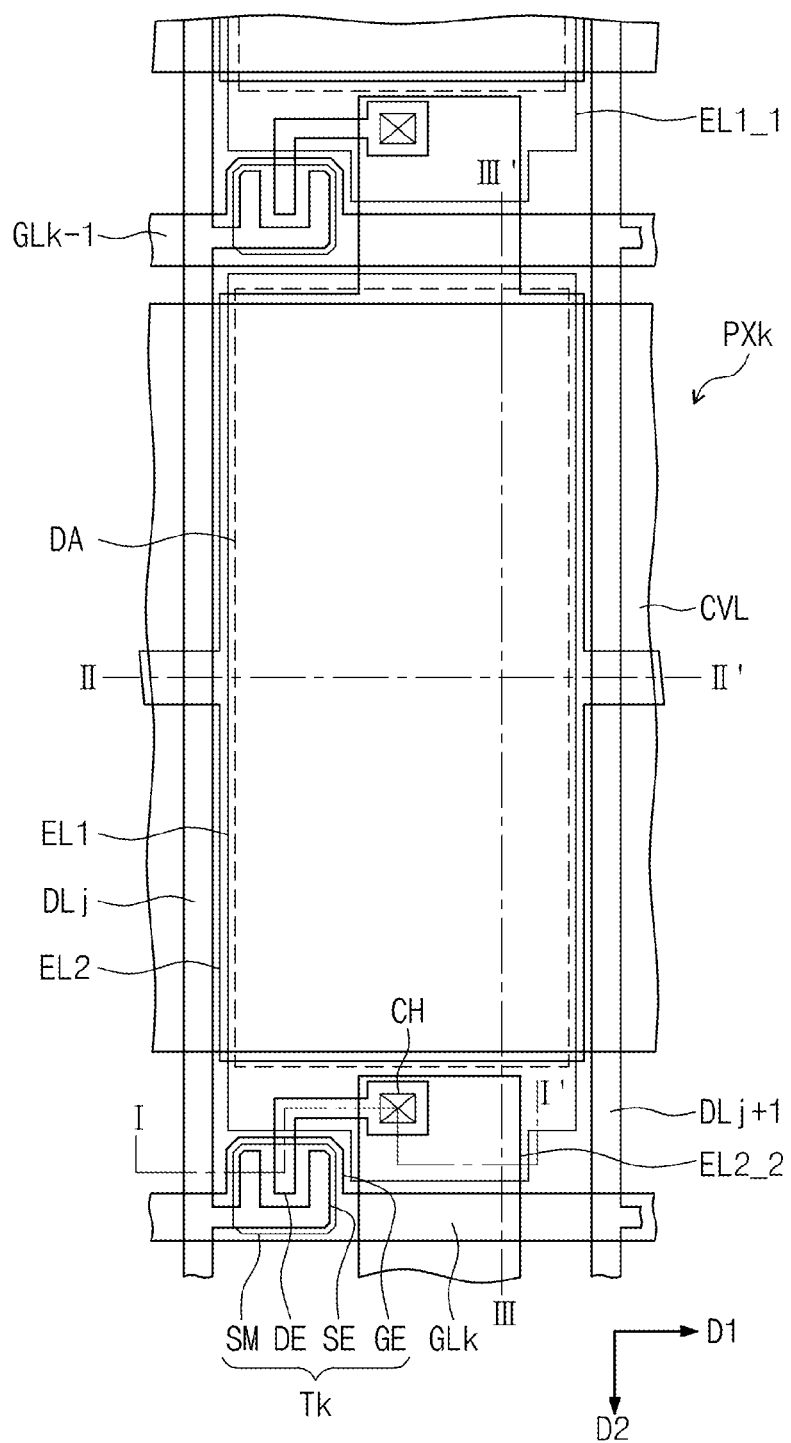
FIG. 4 is a plan view showing further details of a portion of the display panel of FIG. 3.
Figure 5A:
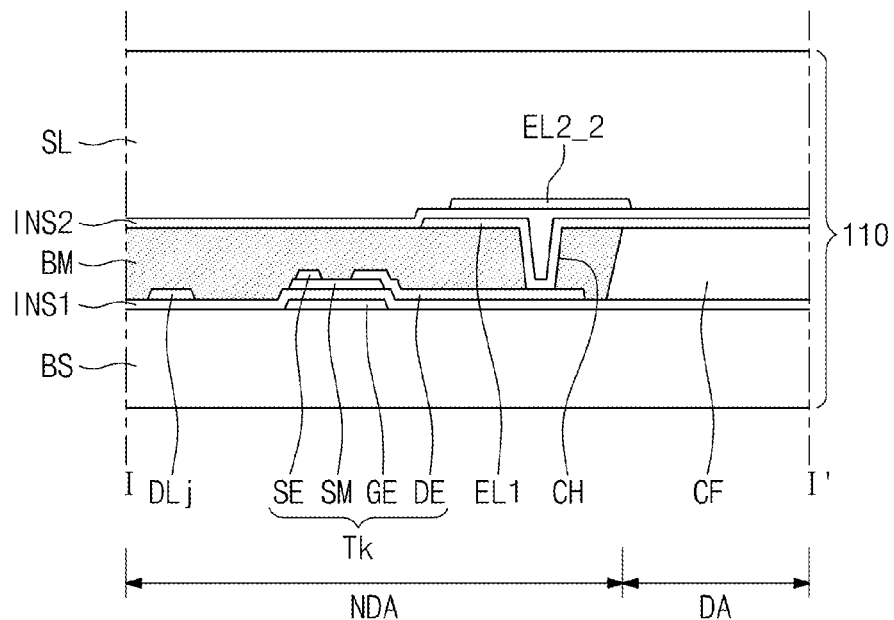
FIG. 5A is a cross-sectional view taken along a line I-I of FIG. 4.
Figure 5B:
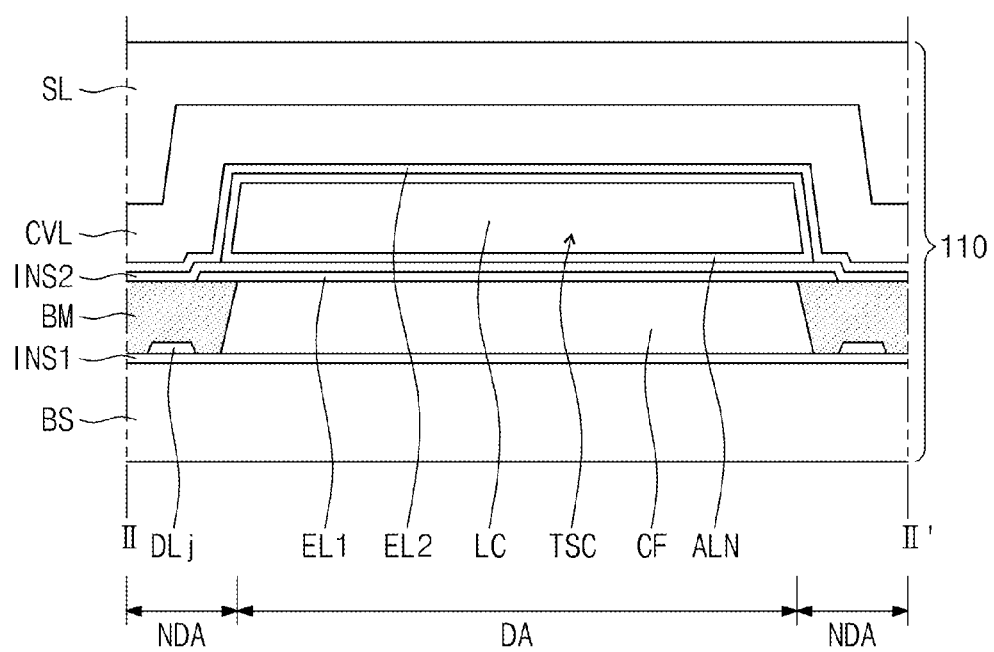
FIG. 5B is a cross-sectional view taken along a line II-II' of FIG. 4.
Figure 5C:
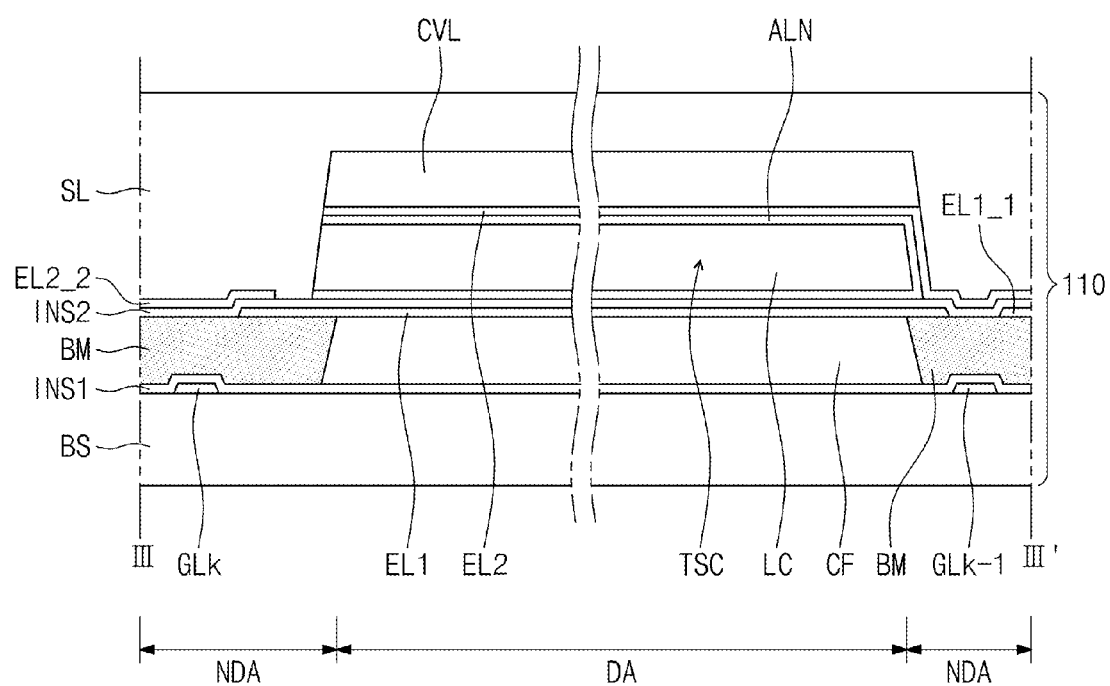
FIG. 5C is a cross-sectional view taken along a line of III-III' of FIG. 4.

FIG. 4 is a plan view showing further details of a portion of the display panel of FIG. 3. FIG. 5A is a cross-sectional view taken along a line I-I' of FIG. 4, FIG. 5B is a cross-sectional view taken along a line II-II' of FIG. 4, and FIG. 5C is a cross-sectional view taken along a line of III-III' of FIG. 4.

Referring to FIGS. 4, 5A, 5B, and 5C, the display panel 110 includes a base substrate BS, color filters CF disposed on the base substrate BS, a black matrix BM disposed between the color filters CF, and the pixel.

According to the embodiments of the present disclosure, the display device includes a plurality of pixels, and the pixels are arranged in the matrix form defined by a plurality of columns and a plurality of rows. Since the pixels have the same repeated structure, hereinafter for the convenience of explanation, only one pixel will be described in detail. In FIGS. 4, 5A, 5B, and 5C, one pixel PXk is illustrated, along with a portion of the first adjacent pixel PXk−1 and a portion of the second adjacent pixel PXk+1, which are adjacent to the pixel PXk. The pixel has a generally rectangular shape with a major axis extending in one direction, however, it should not be limited thereto or thereby. For instance, the pixel may have various shapes in a plan view, such as a V shape, a Z shape, other polygonal shape, etc.

The base substrate BS is a transparent or non-transparent insulating substrate, e.g., a silicon substrate, a glass substrate, a plastic substrate, etc. The base substrate BS includes pixel areas corresponding to the pixels in a one-to-one correspondence relationship. Each pixel area includes a display area DA for displaying the image, and a non-display area NDA disposed adjacent to at least one side of the display area DA and corresponding to an area outside the display area DA.

A wiring part used to transmit a signal to the pixel and a thin film transistor TFT used to drive the pixel are disposed on the base substrate BS. The wiring part includes a gate line GL and a data line DL disposed in the non-display area NDA. The gate line GL extends generally in the first direction D on the base substrate BS.

The data line DL is disposed on the base substrate BS and is insulated from the gate line GL with a first insulating layer INS1 placed between the two. The first insulating layer INS1 is disposed on the gate line GL. The first insulating layer INS1 is formed of an insulating material, such as silicon nitride or silicon oxide. The data line DL extends generally in the second direction D2, which is substantially perpendicular to the first direction D1.

The thin film transistor TFT is connected to the gate line GL and the data line DL, and the thin film transistor TFT includes a gate electrode GE, a semiconductor layer SM, a source electrode SE, and a drain electrode DE.

The gate electrode GE is protruded from the gate line GL or is disposed on a portion of the gate line GL. The gate line GL and the gate electrode GE are formed of a metal material, such as nickel, chrome, molybdenum, aluminum, titanium, copper, tungsten, and/or one or more alloys thereof. The gate line GL and the gate electrode GE may have a single-layer structure or a multi-layer structure using layers of metals. For instance, the gate line GL and the gate electrode GE may have a triple-layer structure with layers of molybdenum, aluminum, and molybdenum which are sequentially stacked, or a double-layer structure with layers of titanium and copper which are sequentially stacked. In addition, the gate line GL and the gate electrode GE may have a single-layer structure with a layer of titanium or copper.

The first insulating layer INS1 is disposed on an entire (or substantially entire) surface of the base substrate BS to cover the gate electrode GE.

The semiconductor layer SM is disposed on the gate line GL while interposing the first insulating layer INS1 therebetween. The source electrode SE is branched from the data line DL and partially overlapped with the semiconductor layer SM. The drain electrode DE is spaced apart from the source electrode SE on the semiconductor layer SM. The semiconductor layer SM forms a conductive channel between the source electrode SE and the drain electrode DE when the transistor Tk is turned on.

Each of the source electrode SE and the drain electrode DE includes a conductive material, such as metal. Each of the source electrode SE and the drain electrode DE may be formed of a single metal material, but embodiments of the invention should not be limited thereto or thereby. For instance, the source electrode SE and the drain electrode DE may be formed of two or more metal materials, or an alloy of two or more metal materials. The metal material includes nickel, chrome, molybdenum, aluminum, titanium, copper, tungsten, and/or one or more alloys thereof. Also, each of the source electrode SE and the drain electrode DE may have a single-layer structure or a multi-layer structure. For instance, each of the source electrode SE and the drain electrode DE may have a double-layer structure with layers of titanium and copper.

Each color filter CF provides a desired color attribute to light passing through each pixel. Each color filter CF may be one of a red color filter, a green color filter, and a blue color filter for example, and each color filter CF is disposed corresponding to each pixel area PA. Also, the color filters CF may further include a white color filter. The color filters CF can be alternately disposed in such a manner that adjacent pixels display colors different from each other, although any arrangement of color filters is contemplated. Although not shown in figures, adjacent color filters CF may be partially overlapped with each other at a boundary of the pixels.

The black matrix BM is disposed in the non-display area NDA to block light that is unnecessary for display of images. The black matrix BM prevents the light from leaking through the edge of the image display part, where this leakage can be caused by the abnormal behavior of liquid crystal molecules. The black matrix BM also prevents colors from being mixed at the edge of the pixels, where this undesired mixing is caused by the overlap between the color filters CF. The black matrix BM is disposed at at least one side of each color filter CF to surround each color filter CF.

The black matrix BM is provided with a contact hole CH formed therethrough to expose a portion of the drain electrode DE of the thin film transistor TFT.

Although not shown in the Figures, a protective layer can be disposed between the thin film transistor TFT and the color filters CF to protect a channel of the thin film transistor TFT. The protective layer covers an exposed upper portion of the semiconductor layer SM.

The pixel is disposed on the base substrate BS. The pixel includes a cover layer CVL that defines a tunnel-shaped cavity TSC in cooperation with the base substrate BS and its various layers, a liquid crystal layer LC provided in the tunnel-shaped cavity TSC, an alignment layer ALN that aligns liquid crystal molecules of the liquid crystal layer LC, and the first and second electrodes EL1 and EL2 that control the liquid crystal molecules of the liquid crystal layer LC.

The first electrode EL1 is disposed on the color filter CF. The first electrode EL1 is connected to the thin film transistor TFT through the contact hole CH formed through the black matrix BM. A second insulating layer INS2 is disposed on the first electrode EL1 to protect the first electrode EL1. The second insulating layer INS2 may be omitted. The second insulating layer INS2 may be formed of an inorganic insulating material or an organic insulating material.

In the present exemplary embodiment, the contact hole CH is formed as an opening in the black matrix BM, but it should not be limited thereto or thereby. For instance, the contact hole CH may be formed as an opening in the color filter CF.

The cover layer CVL extends in the first direction D1 on the second insulating layer INS2. Parts of the cover layer CVL are spaced apart from an upper surface of the second insulating layer INS2 to define tunnel-shaped cavities TSC in cooperation with the second insulating layer INS2. That is, the cover layer CVL is spaced apart from the upper surface of the second insulating layer INS2 in the upward direction to form a predetermined space between the cover layer CVL and the second insulating layer INS2 in the display area DA. The tunnel-shaped cavity TSC has a shape extended in the second direction D2. That is, a major axis of the cavity TSC extends generally in the second direction D2. The cover layer CVL is not present at either end of the tunnel-shaped cavity TSC, that is, opposite ends of the tunnel-shaped cavity TSC in the second direction D2, so that both ends of the tunnel-shaped cavity TSC are open. The open areas of the tunnel-shaped cavity TSC corresponding to both ends of the tunnel-shaped cavity TSC are referred to as entrance portions. However, the direction along which the cover layer CVL is formed should not be limited thereto or thereby, and the cover layer CVL may be extended in any direction different from the first direction D1.

The cover layer CVL may be formed of an organic or inorganic insulating layer. In the present exemplary embodiment, the cover layer CVL has a single-layer structure, but it should not be limited thereto or thereby. For instance, the cover layer CVL may have a multi-layer structure, such as a triple-layer structure in which an inorganic insulating layer, an organic insulating layer, and an inorganic insulating layer are sequentially stacked. The second electrode EL2 is disposed along a lower surface of the cover layer CVL, and extended in the first direction D1 in which the cover layer CVL is extended. In the present exemplary embodiment, a length of the second electrode EL2 in the second direction D2 in the non-display area NDA is smaller than a length of the second electrode EL2 in the second direction D2 in the display area DA. That is, a portion of the second electrode EL2 extends farther into the non-display area NDA than the remainder of the second electrode EL2.

In addition, a portion of the first electrode EL1 of the pixel PXk overlaps a portion of the second electrode EL2_2 of the second adjacent pixel PXk+1. Similarly, a portion of the first electrode EL1_1 of the first adjacent pixel PXk−1 overlaps a portion of the second electrode EL2 of the pixel PXk.

The second electrode EL2 forms an electric field in cooperation with the first electrode EL1. The second electrode EL2 is shared by the adjacent pixels in the direction of the major axis of second electrode EL2. The second electrode EL2 is spaced apart from the second insulating layer INS2 in the upward direction in the display area DA, and the second electrode EL2 directly contacts the second insulating layer INS2 in the non-display area NDA.

The second electrode EL2 is connected to the common voltage line (See FIG. 3) which is disposed in the non-display area NDA. The second electrode EL2 receives the common voltage from the common voltage line.

Each of the first and second electrodes EL1 and EL2 is formed of a transparent or non-transparent conductive material, such as a metal. That is, each of the first and second electrodes EL1 and EL2 may be selectively formed of either the transparent conductive material or the non-transparent conductive material in accordance with the desired operational mode of the display device. For instance, when the display device is a transmission type display device having a backlight unit disposed under the base substrate BS, the first and second electrodes EL1 and EL2 may be formed of a transparent conductive material. Alternatively, when the display device is a reflection type display device which does not require a separate light source, the first electrode EL1 may be formed of a non-transparent conductive material which is able to reflect the light, and the second electrode EL2 may be formed of the transparent conductive material. The transparent conductive material can include a transparent conductive oxide such as indium tin oxide (ITO), indium zinc oxide (IZO), indium tin zinc oxide (ITZO), etc. The non-transparent conductive material can include a metal such as nickel, chrome, molybdenum, aluminum, titanium, copper, tungsten, and/or alloys thereof. Other elements including the cover layer CVL may be formed of a transparent or non-transparent material depending on the operational mode of the display device.

The liquid crystal layer LC is provided in the tunnel-shaped cavity TSC. The liquid crystal layer LC is disposed between the first electrode EL1 and the second electrode EL2, which face each other, a voltage difference is applied between electrodes EL1 and El2, and the liquid crystal layer LC is controlled by the resulting electric field to display the image.

The liquid crystal layer LC includes liquid crystal molecules having an optical anisotropic property. The liquid crystal molecules are driven by the electric field to transmit or block the light passing through the liquid crystal layer LC and to thereby display the image.

The alignment layer ALN is disposed between the first electrode EL1 and the liquid crystal layer LC and between the second electrode EL2 and the liquid crystal layer LC. The alignment layer ALN can line one or more of the inner surfaces of the tunnel-shaped cavity TSC. The alignment layer ALN is used to pre-tilt the liquid crystal molecules, and includes an organic polymer such as polyimide and/or polyamic acid.

Meanwhile, an inorganic insulating layer (not shown) may be further disposed between the liquid crystal layer LC and the second electrode EL2 and/or between the second electrode EL2 and the cover layer CVL. The inorganic insulating layer includes silicon nitride or silicon oxide. The inorganic insulating layer supports the cover layer CVL to allow the cover layer CVL to stably maintain the tunnel-shaped cavity TSC.

A sealing layer SL is disposed on the cover layer CVL. The sealing layer SL covers the display area DA and the non-display area NDA. The sealing layer SL blocks both entrance portions of the tunnel-shaped cavity TSC, to thus seal the tunnel-shaped cavity TSC. That is, the tunnel-shaped cavity TSC is sealed by the second insulating layer INS2, the second electrode EL2, and the sealing layer SL. When the second insulating layer INS2 is omitted, the tunnel-shaped cavity TSC is sealed by the first electrode EL1, the second electrode EL2, and the sealing layer SL.

The sealing layer SL includes an organic polymer. The organic polymer may be a poly (p-xylene) polymer, that is, parylene.

The liquid crystal layer LC having the above-mentioned structure is driven by an electrically controlled birefringence (ECB) mode in which the liquid crystal molecules are positive type liquid crystal molecules. However, a part of the optical member (defined below) may be omitted or the optical member may further include additional parts in accordance with the type of the liquid crystal layer LC, e.g., a positive type or a negative type, and the driving mode of the display device, e.g., an in-plane switching mode, a vertical alignment mode, the ECB mode, etc.

In the display device according to the present exemplary embodiment, when a gate signal is applied to the gate electrode GE through the gate line GL and a data signal is applied to the source electrode SE through the data line DL, a conductive channel (hereinafter, referred to as a channel) is formed in the semiconductor layer SM. Thus, the thin film transistor TFT is turned on to apply the data signal to the first electrode EL1, so that an electric field is generated between the first electrode EL1 and the second electrode EL2. The liquid crystal molecules are driven or oriented by the electric field, and the image is displayed according to an amount of light passing through the liquid crystal layer LC, as determined by the orientation of the liquid crystal molecules.

FIG. 6 is a flowchart showing a method of manufacturing the display device according to an exemplary embodiment of the present disclosure.

Referring to FIG. 6, in order to manufacture the display device according to the present exemplary embodiment, the thin film transistor and the color filter part are formed on the base substrate BS (S110, S120). Then, the first electrode EL1, a sacrificial layer SCR, the second electrode EL2, and the cover layer CVL are sequentially formed on the color filters (S130, S140, S150, S160), and the sacrificial layer SCR is removed (S170). After that, the alignment layer ALN is formed (S180), the liquid crystal layer LC is formed (S190), and the sealing layer SL is formed to seal the liquid crystal layer LC (S200). After that, a test process is performed on the display panel 110 (S210).

If the thin film transistor Tk is determined to be defective during the test process, a repair process is performed to connect the liquid crystal capacitor CLCk to the adjacent pixels as previously described with reference to FIG. 3 (S220). That is, the first electrode EL1 of the liquid crystal capacitor CLCk in the pixel PXk is disconnected from the thin film transistor Tk, and the first electrode EL1 of the liquid crystal capacitor CLCk is electrically connected to the second electrode EL2_2 of the liquid crystal capacitor CLCk+1 in the second adjacent pixel PXk+1. In addition, the second electrode EL2 of the liquid crystal capacitor CLCk in the pixel PXk is disconnected from the common voltage line VCL, and the second electrode EL2 of the liquid crystal capacitor CLCk is electrically connected to the first electrode EL1_1 of the liquid crystal capacitor CLCk−1 in the first adjacent pixel PXk−1.

After the repair process is completed, the optical member is attached (S230).

FIGS. 7A to 11A are plan views illustrating portions of this manufacturing method in further detail. FIGS. 7B to 11B are cross-sectional views taken along lines I-I' of FIGS. 7A to 11A, respectively. FIGS. 12A to 23A and FIGS. 12B to 23B are cross-sectional views showing a remaining part of this manufacturing method in more detail. In detail, FIGS. 12A to 23A are cross-sectional views taken along a line II-II' of FIG. 11A, and FIGS. 12B to 23B are cross-sectional views taken along a line III-III' of FIG. 11A.

Figure 7A:
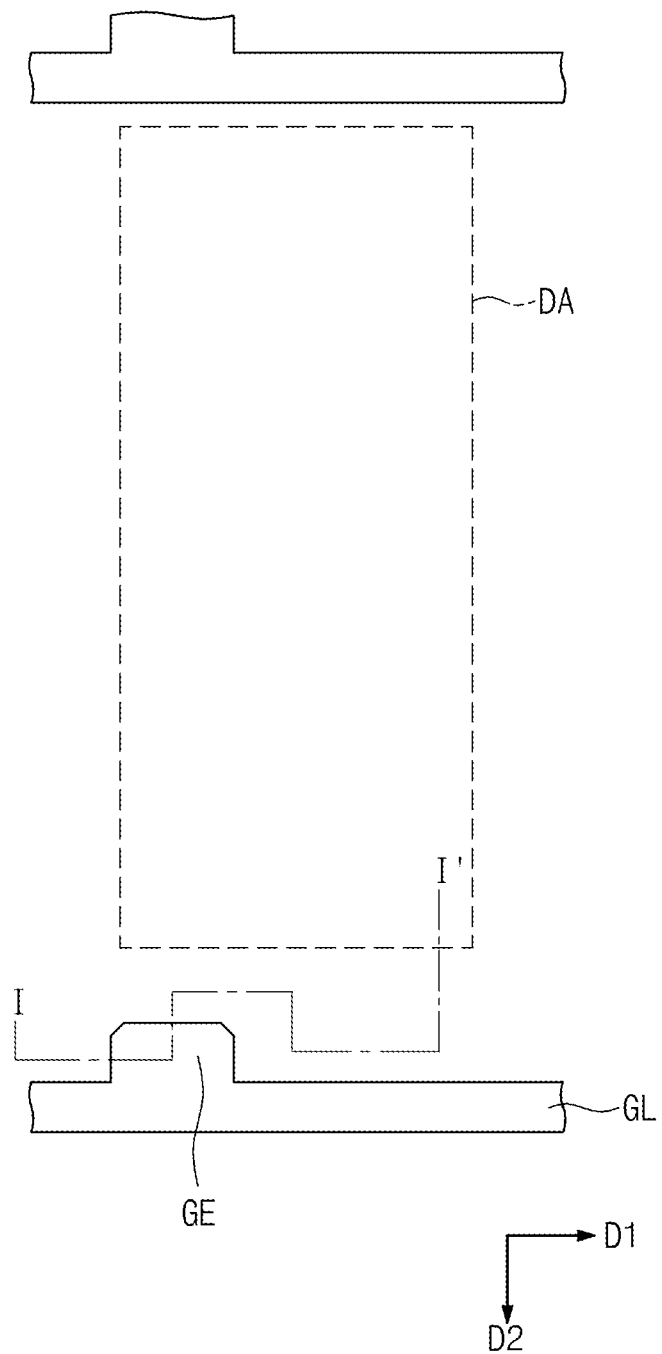
Figure 7B:
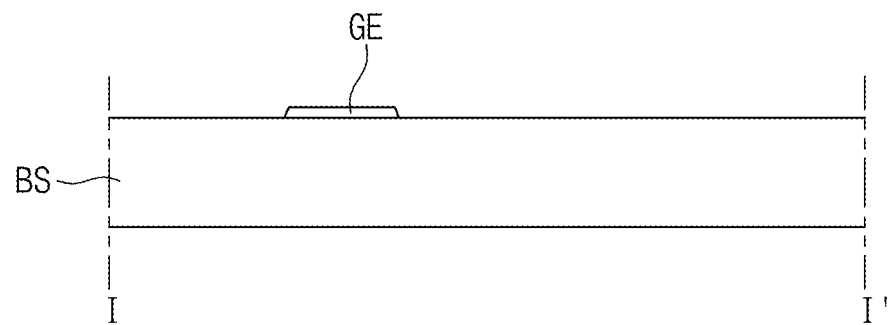

Referring to FIGS. 7A and 7B, a gate line part is formed on the base substrate BS. The gate line part includes the gate line GL and the gate electrode GE.

The gate line part is formed of a conductive material, such as a metal. The gate line part is formed by forming a metal layer on the entire surface of the base substrate BS and patterning the metal layer through a photolithography process. The gate line part shown has a single-layer structure of a single metal or a metal alloy, but it should not be limited thereto or thereby. The gate line part may alternatively have a multi-layer structure of two or more layers of metals and/or alloys thereof.

Figure 8A:
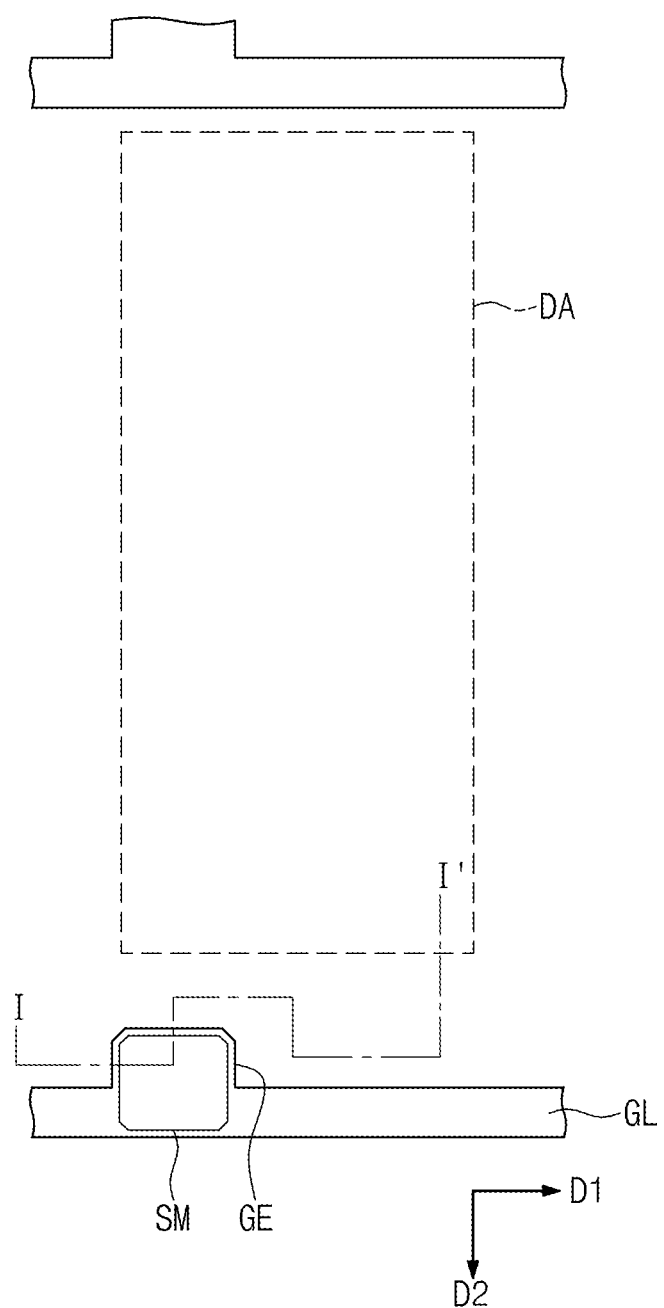
Figure 8B:
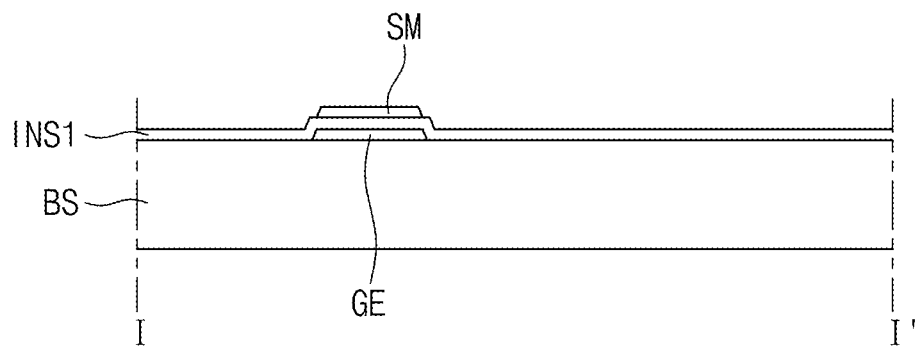

Referring to FIGS. 8A and 8B, the first insulating layer INS1 is formed on the gate line part, and the semiconductor layer SM is formed on the first insulating layer INS1. The semiconductor layer SM is formed on the gate electrode GE and overlaps at least a portion of the gate electrode GE when viewed in a plan view. The semiconductor layer SM may include doped silicon, non-doped silicon, or an oxide semiconductor.

Figure 9A:
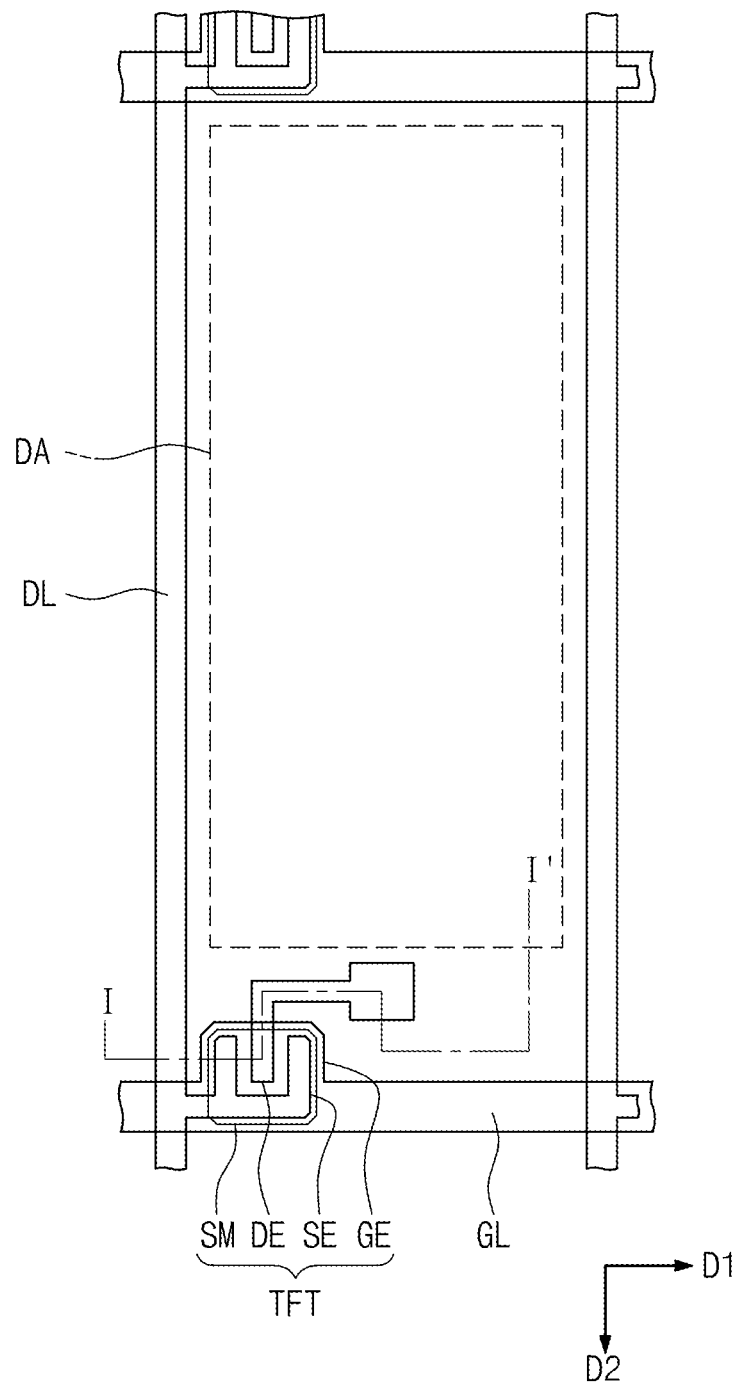
Figure 9B:
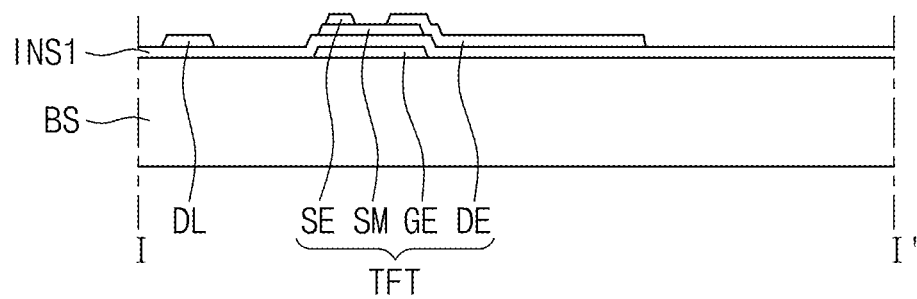

Referring to FIGS. 9A and 9B, a data line part is formed on the semiconductor layer SM. The data line part includes the data line DL, the source electrode SE, and the drain electrode DE.

The data line part is formed of a conductive material, such as a metal. The data line part is formed by forming a metal layer on the entire surface of the base substrate BS and then patterning the metal layer through a photolithography process. The data line part shown has a single-layer structure of a single metal or a metal alloy, but it should not be limited thereto or thereby. The data line part may instead have a multi-layer structure of two or more layers of metals and/or alloys thereof.

The gate electrode GE, the source electrode SE, the drain electrode DE, and the semiconductor layer SM collectively form the thin film transistor TFT (S110).

Figure 10A:
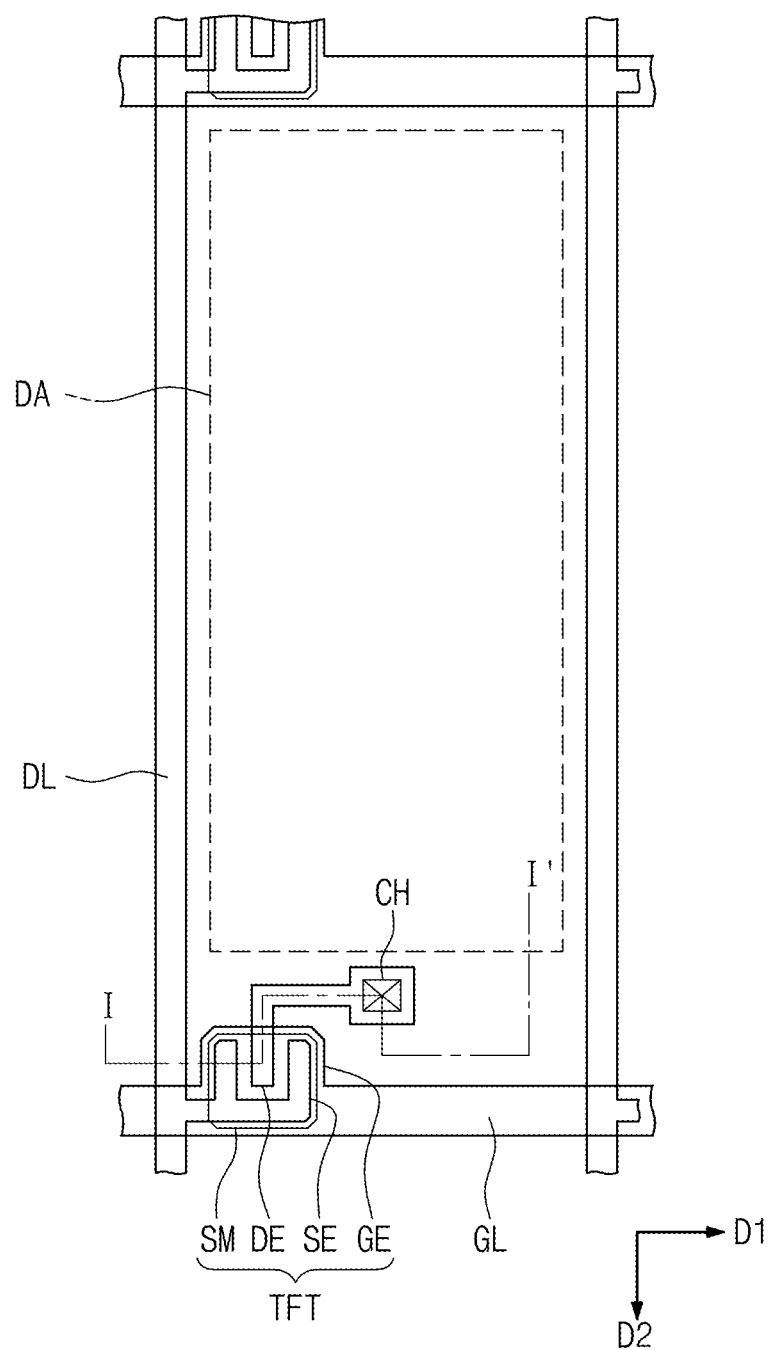
Figure 10B:
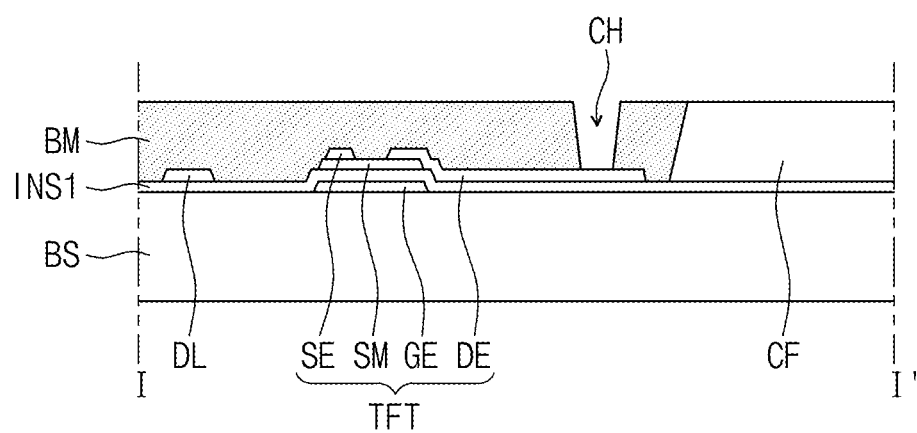

Referring to FIGS. 10A and 10B, the color filters CF and the black matrix BM are formed on the base substrate BS and are formed over the display area DA and data line part respectively (S120), and the contact hole CH is formed through the black matrix BM to expose a portion of the drain electrode DE.

The color filter CF is formed by forming a color layer on the base substrate BS, where the color layer passes red, green, blue, or another color, and then patterning the color layer through a photolithography process. However, a method of forming the color filters CF should not be limited thereto or thereby. According to another embodiment of the present disclosure, the color filter CF may be formed through an inkjet process instead of a photolithography process. The black matrix BM is formed by forming a light blocking layer, which absorbs the light, on the base substrate BS and then patterning the light blocking layer through a photolithography process. However, the black matrix BM may be formed through another method, e.g., an inkjet process. The color layer for the color filters CF, and the black matrix BM, may be formed in various orders. For instance, the black matrix BM can be formed after the red, green, and blue color layers are formed, or the red, green, and blue color layers can be formed after the black matrix BM is formed. The color layers and black matrix BM may be formed in these or any other orders as desired.

The contact hole CH is formed by patterning the black matrix BM using a photolithography process.

Although not shown in the figures, an additional insulating layer (e.g., a passivation layer) may be further disposed between the thin film transistor TFT and the color filter part. This additional insulating layer protects the channel of the thin film transistor TFT and prevents foreign substances in the color filters CF from diffusing into the thin film transistor TFT.

Figure 11A:
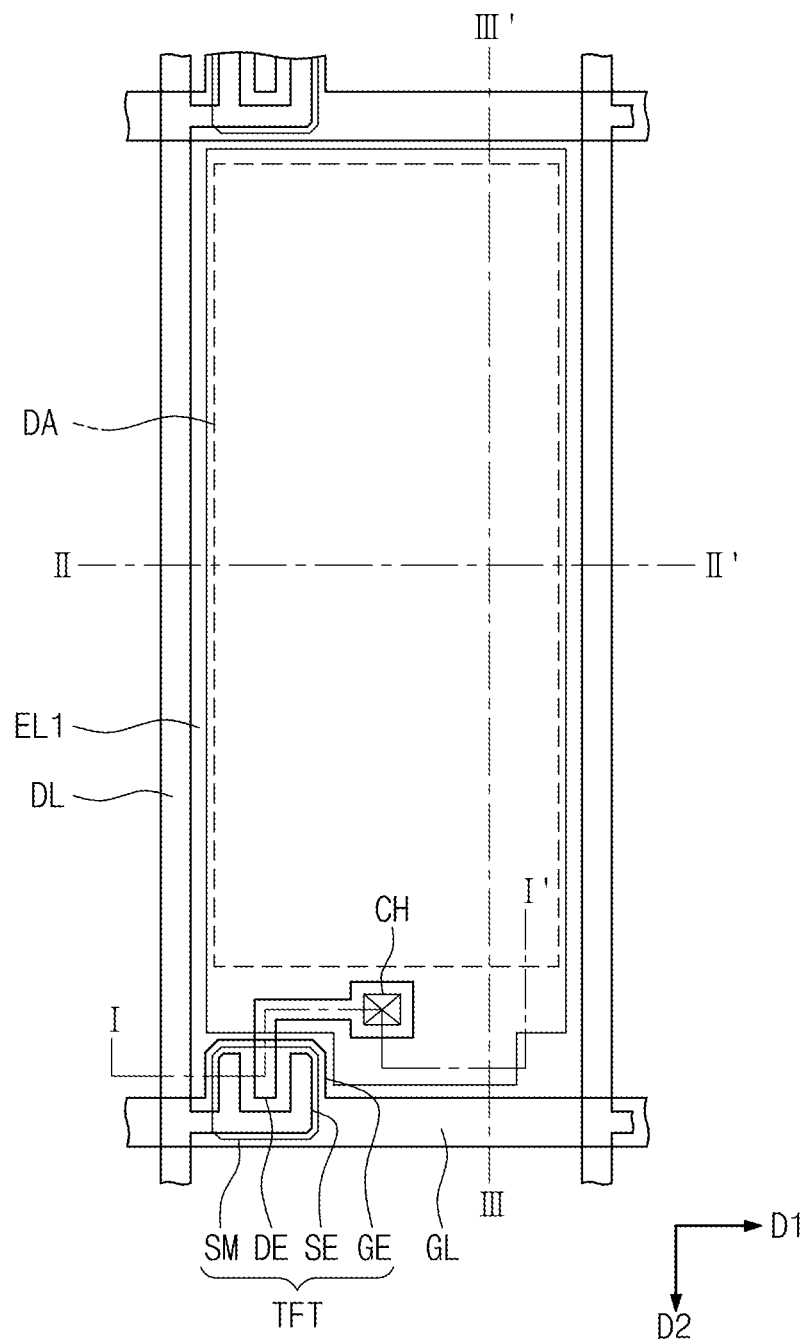
Figure 11B:
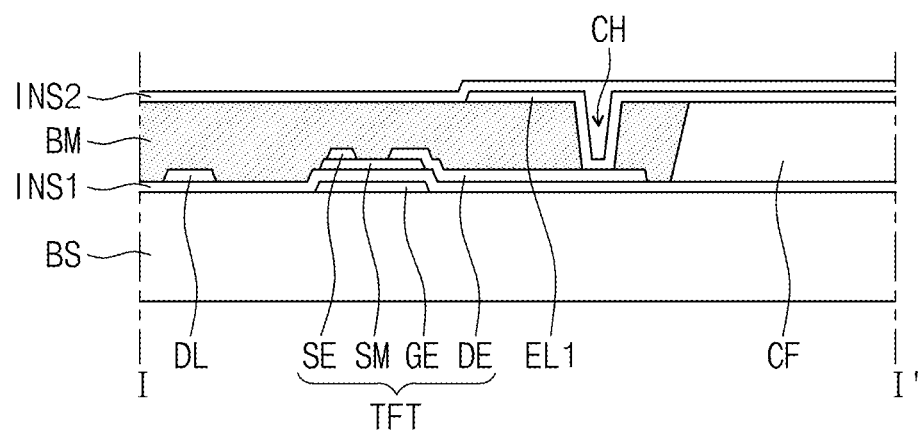

Referring to FIGS. 11A and 11B, the first electrode EL1 is formed on the color filter part (S130).

The first electrode EL1 is formed by forming a conductive layer (using a conductive material) on the color filter part, and then patterning the conductive layer using a photolithography process. The first electrode EL1 is connected to the drain electrode DE through the contact hole CH.

The second insulating layer INS2 is formed on the first electrode EL1 to protect the first electrode EL1.

Figure 12A:
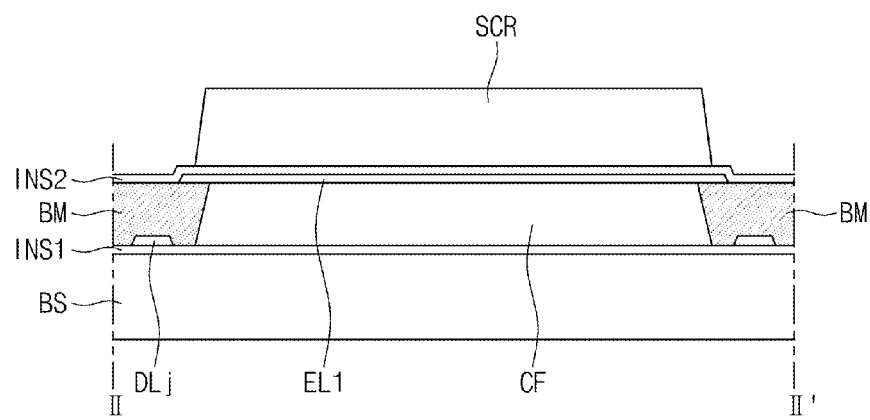
Figure 12B:
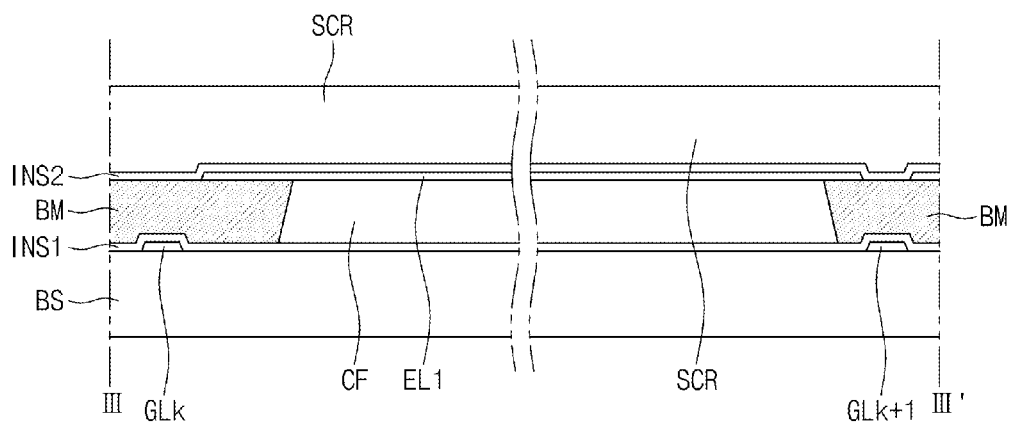

Referring to FIGS. 12A and 12B, the sacrificial layer SCR is formed on the second insulating layer INS2 (S140).

The sacrificial layer SCR covers the display area DA and is extended (i.e. has a major axis oriented) generally in the second direction D2. That is, the sacrificial layer SCR has a long bar shape extended along a column direction of the pixels when the first direction D1 is referred to as a row direction and the second direction D2 is referred to as the column direction. However, the direction in which the sacrificial layer SCR is extended should not be limited thereto or thereby, and thus the sacrificial layer SCR may be extended in the first direction D1, or any other desired direction, to have any desired shape.

Since the sacrificial layer SCR is removed to define the tunnel-shaped cavity TSC, the sacrificial layer SCR is formed in a region where the liquid crystal layer LC is to be placed later to a desired width and a height, which correspond to a width and a height of the tunnel-shaped cavity TSC, respectively.

Figure 13A:
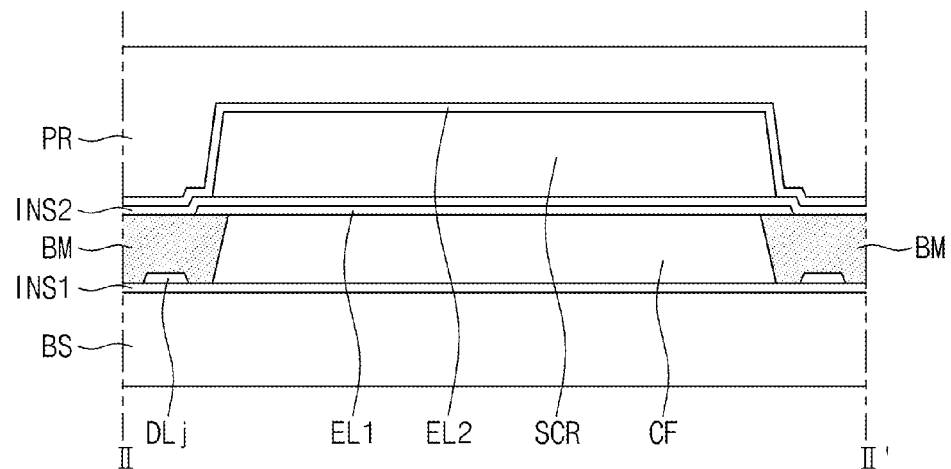
Figure 13B:
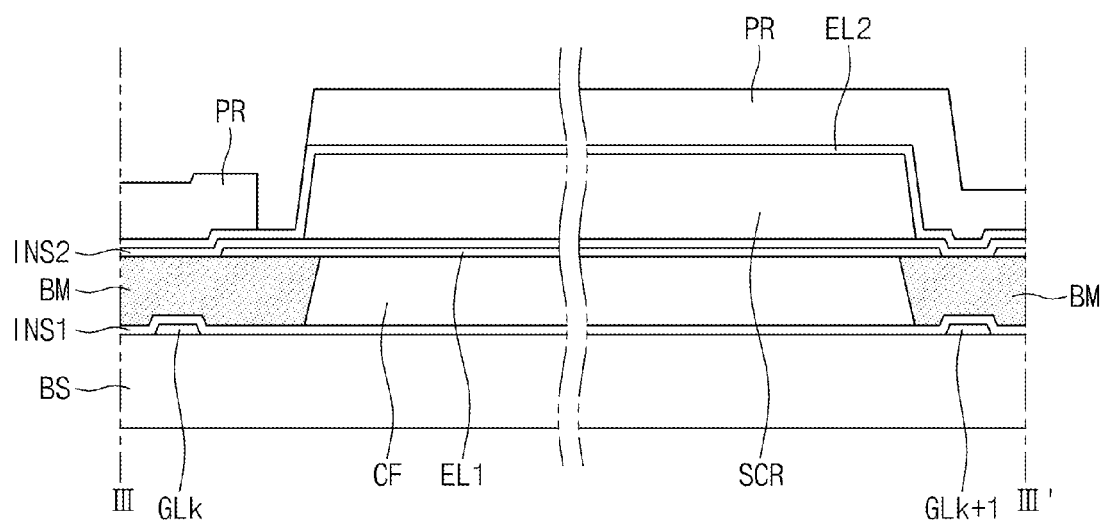

Referring to FIGS. 13A and 13B, a conductive layer is formed on the sacrificial layer SCR, and a photoresist pattern PR is formed on the conductive layer.

The conductive layer includes a transparent conductive material, e.g., ITO, IZO or the like, and the conductive layer can be formed by a physical vapor deposition process.

The photoresist pattern PR is formed in a region where the second electrode EL2 is to be formed. The photoresist pattern PR is formed by coating a photoresist on the conductive layer, exposing the photoresist to a light, and then developing the exposed photoresist.

Figure 14A:
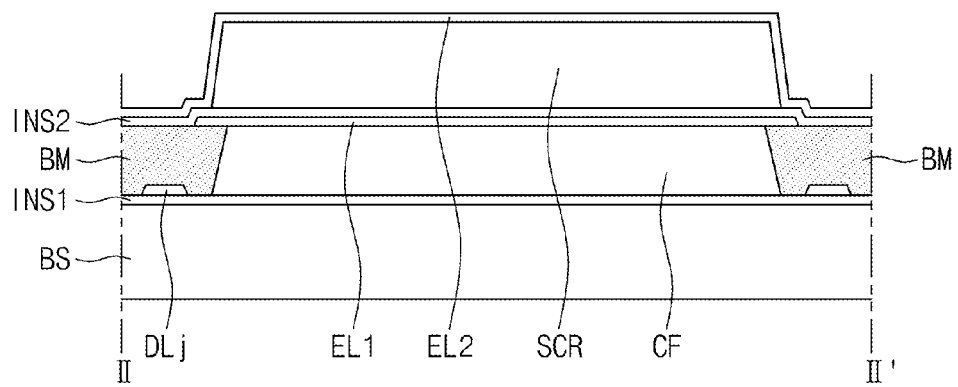
Figure 14B:
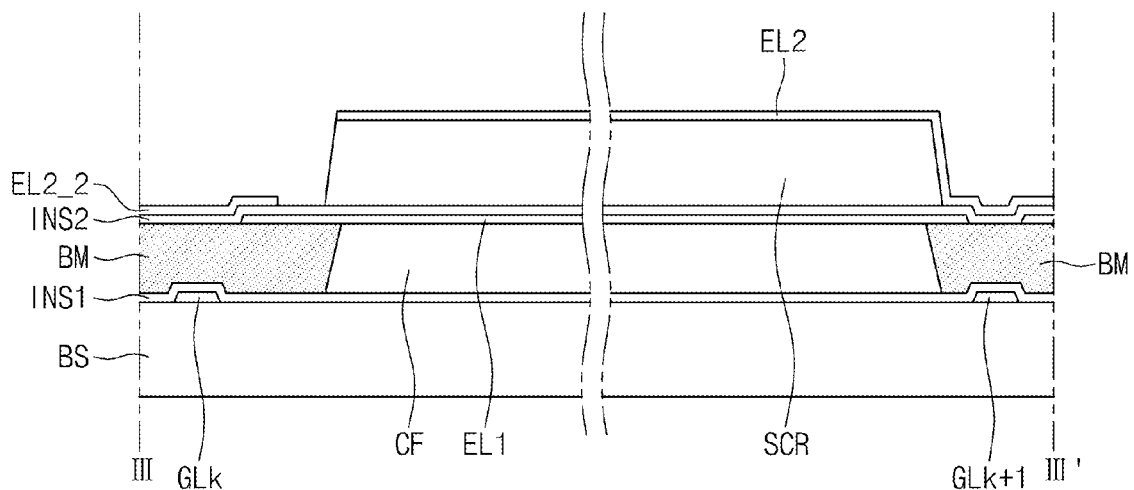

Referring to FIGS. 14A and 14B, the second electrode EL2 is formed on the sacrificial layer SCR (S150). The second electrode EL2 is formed by etching the conductive layer using the photoresist pattern PR as a mask. That is, the second electrode EL2 is formed from the material of the conductive layer. Then, the photoresist pattern PR is removed.

Figure 15A:
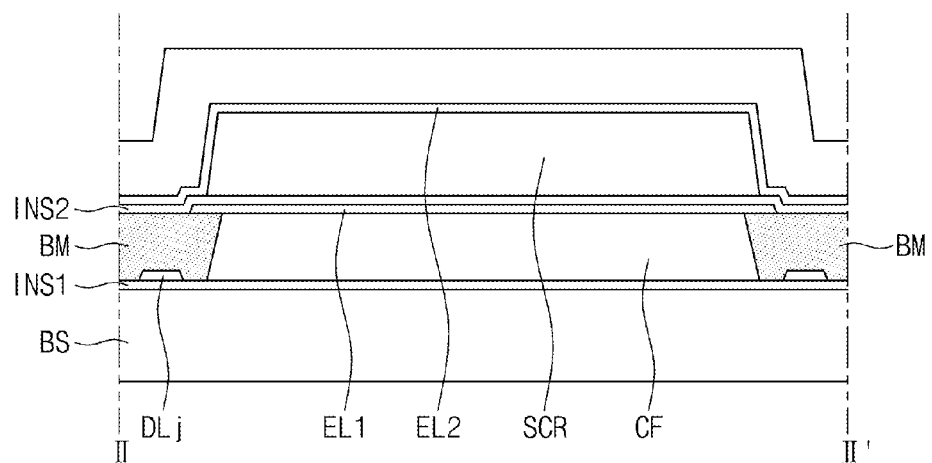
Figure 15B:
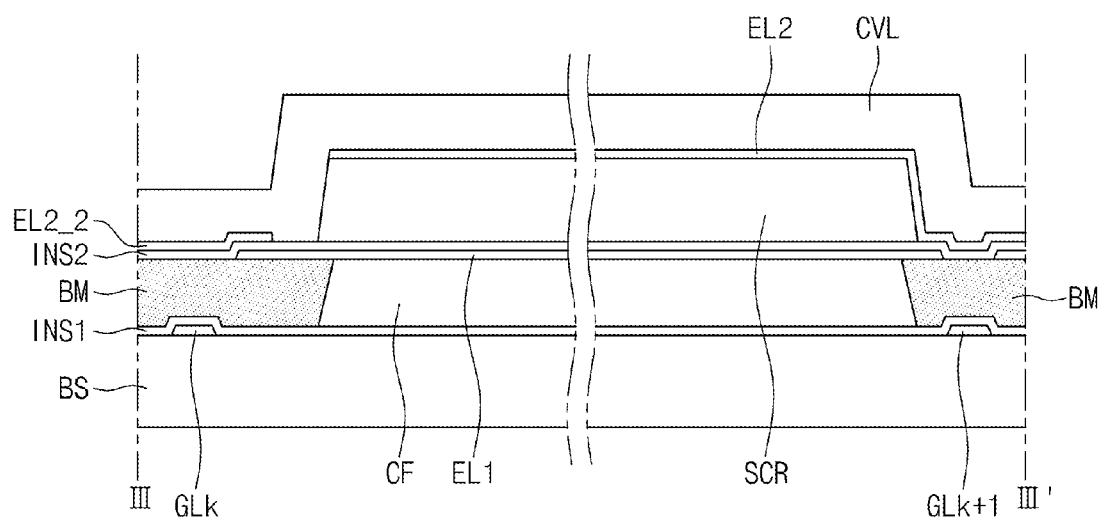

Referring to FIGS. 15A and 15B, the cover layer CVL is formed on the base substrate BS on which the second electrode EL2 is formed (S160).

The cover layer CVL is extended generally in the first direction D and covers the second electrode EL2. The second electrode EL2 overlaps the cover layer CVL and has substantially the same shape as that of the cover layer CVL. However, the cover layer CVL may be formed to have an area in plan view that is larger than that of the second electrode EL2, such that the cover layer CVL fully covers the second electrode EL2 even after taking alignment error in the manufacturing process into consideration. The cover layer CVL is not formed at both ends of the display area DA in the second direction D2. Thus, an upper surface of the sacrificial layer SCR corresponding to the ends of the display area DA in the second direction D2 is exposed.

Figure 16A:
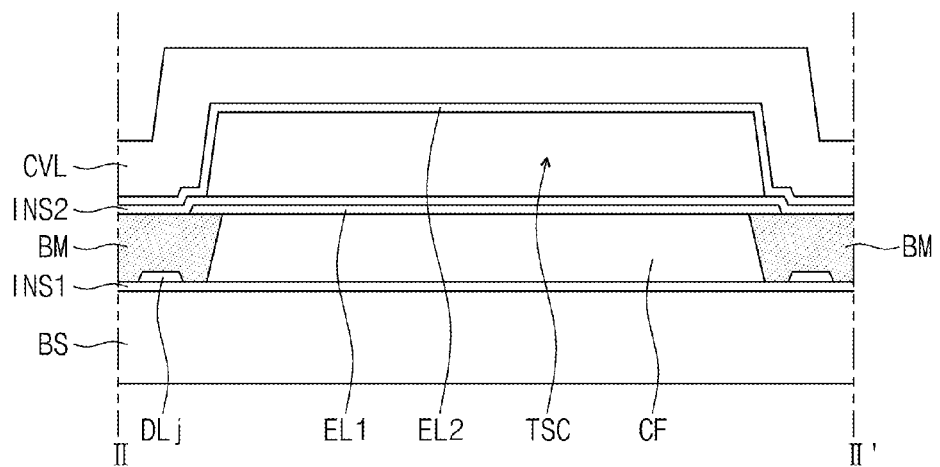
Figure 16B:
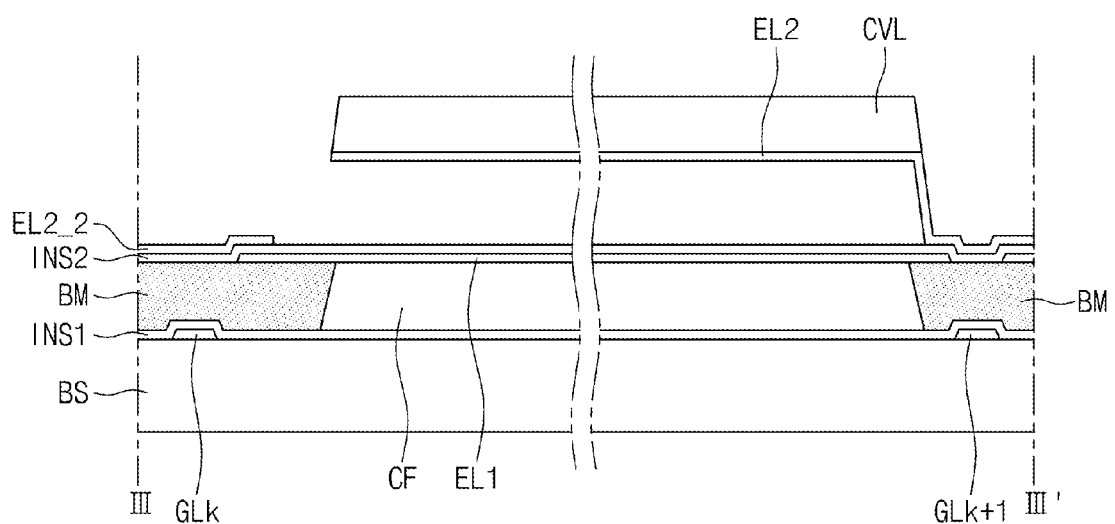

Referring to FIGS. 16A and 16B, the sacrificial layer SCR is removed by a dry-etching process or a wet-etching process to form the tunnel-shaped cavity TSC (S170). The dry-etching process can be performed using a plasma, and the wet-etching process can be performed using various etchants in accordance with the material used for the sacrificial layer SCR. The sacrificial layer SCR is sequentially etched from the exposed upper surface thereof to the inside of the sacrificial layer SCR by the wet-etching process. Thus, an upper surface of the second insulating layer INS2 and a lower surface of the second electrode EL2, which correspond to the display area DA, are exposed, and the tunnel-shaped cavity TSC, which is defined by the upper surface of the second insulating layer INS2, the lower surface of the second electrode EL2, and both ends of the second electrode EL2 in the second direction D2 in the display area DA, is formed.

An inorganic insulating layer may be formed on the sacrificial layer SCR before the second electrode EL2 is formed, and an additional inorganic insulating layer may be formed on the second electrode EL2 before the cover layer CVL is formed. The inorganic insulating layers support the cover layer CVL to allow the cover layer CVL to stably maintain the tunnel-shaped cavity TSC during the etching process.

Figure 17A:
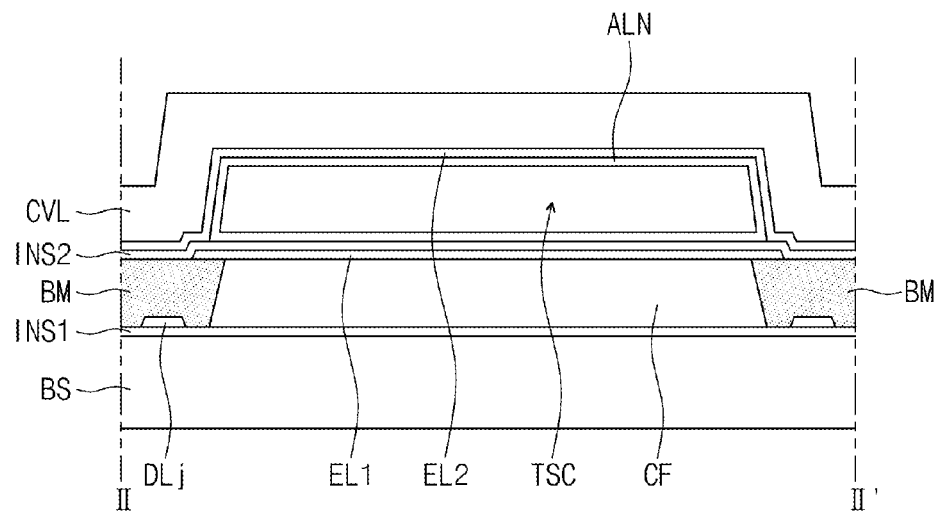
Figure 17B:
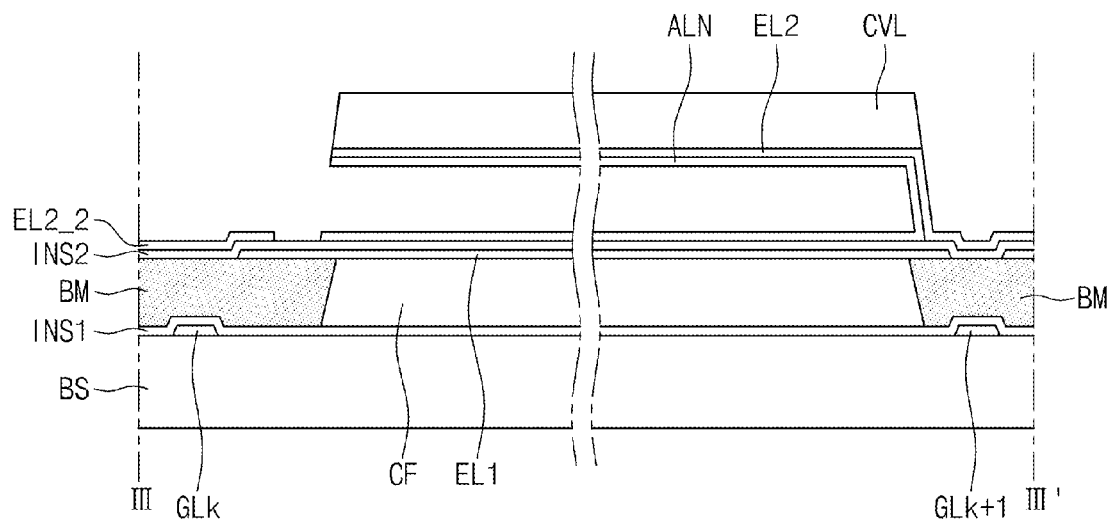

Referring to FIGS. 17A and 17B, the alignment layer ALN is formed in the tunnel-shaped cavity TSC (S180). The alignment layer ALN is formed by providing an alignment solution, which contains an alignment material such as polyimide or polyamic acid mixed with a solvent, in the tunnel-shaped cavity TSC and then removing the solvent by lowering pressure in the tunnel-shaped cavity TSC or applying heat to the tunnel-shaped cavity TSC.

Figure 18A:
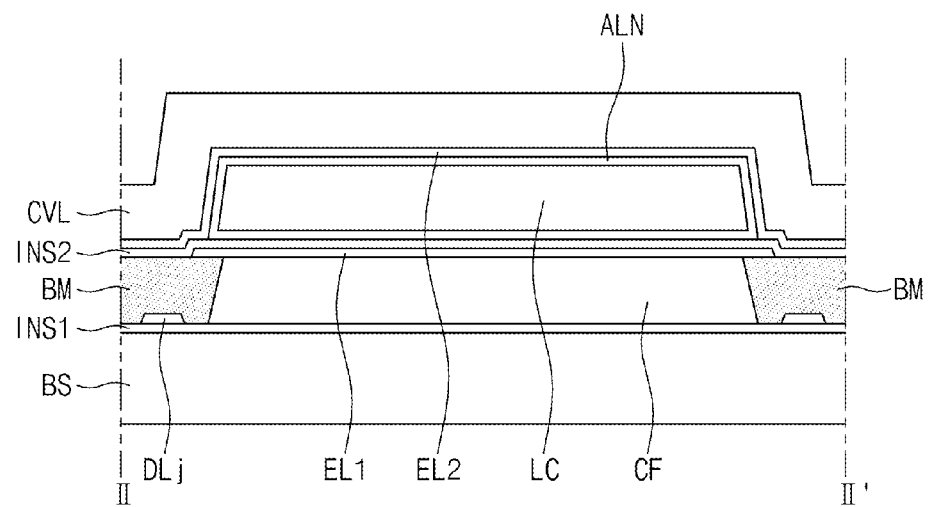
Figure 18B:
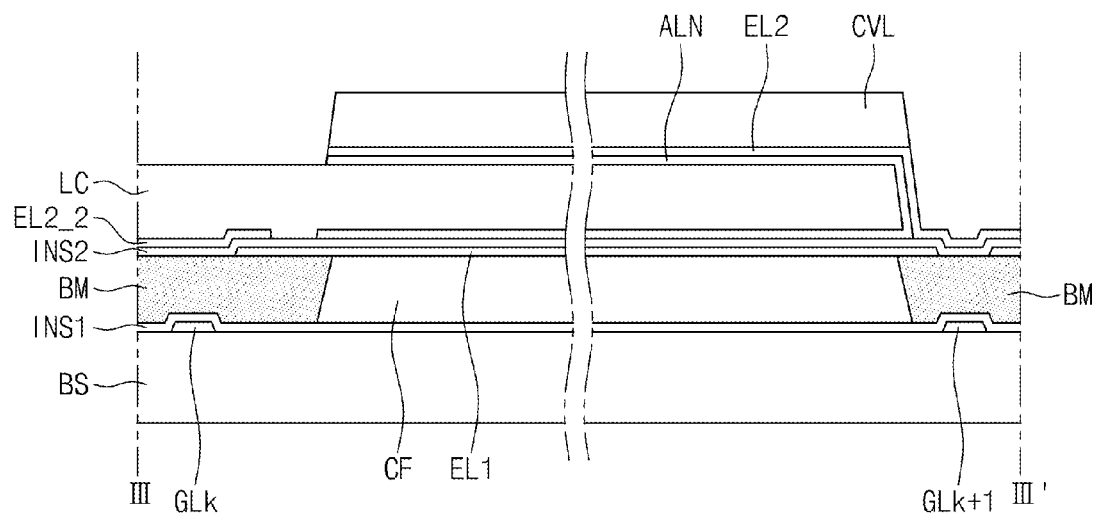
Figure 19A:
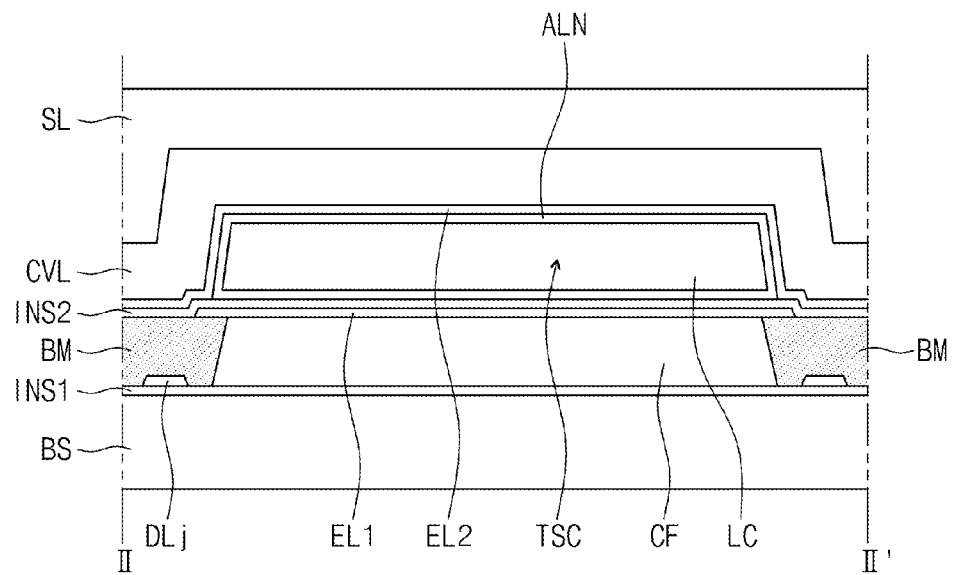
Figure 19B:
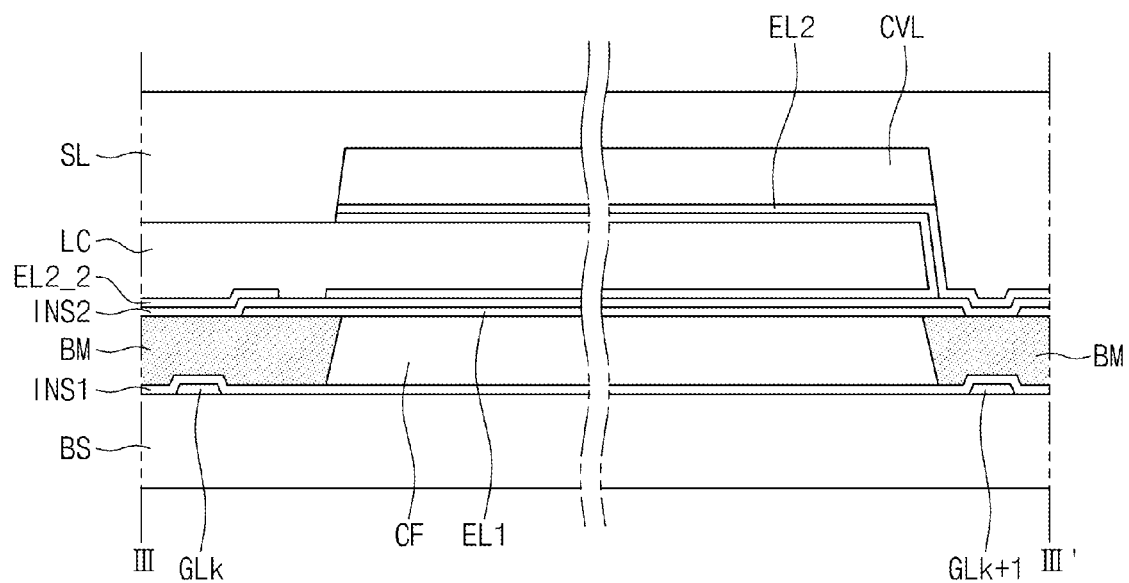

Referring to FIGS. 18A and 18B, the liquid crystal layer LC is formed in the tunnel-shaped cavity TSC (S190). Since the liquid crystal molecules are provided in fluid form, the liquid crystal molecules flow into the tunnel-shaped cavity TSC via a capillary tube phenomenon when the liquid crystal molecules are applied to the tunnel-shaped cavity TSC. The liquid crystal molecules may be applied to the tunnel-shaped cavity TSC using an inkjet device employing a micropipette. As a result, the liquid crystal layer LC enters into the tunnel-shaped cavity TSC and between adjacent tunnel-shaped cavities. Alternatively, the liquid crystal layer LC may be injected into the tunnel-shaped cavity TSC by using a vacuum liquid crystal injection device. To this end, a portion of the base substrate BS in which the tunnel-shaped cavity TSC is formed is dipped into a vessel in a chamber, where the vessel is filled with a liquid crystal material. The pressure of the chamber is lowered and as a result, the liquid crystal material is drawn into the tunnel-shaped cavity TSC by a capillary tube phenomenon. Referring to FIGS. 19A and 19B, the liquid crystal layer LC remaining outside the tunnel-shaped cavity TSC is removed, and the sealing layer SL is formed to surround the tunnel-shaped cavity TSC (S190). The sealing layer SL seals the opening portion of the tunnel-shaped cavity TSC, i.e., the entrance portions through which the liquid crystal molecules are injected.

The sealing layer SL is formed by a vacuum deposition method using an organic polymer, e.g., poly(p-xylene)polymer (i.e., parylene).

Then, the test process is performed on the display panel 110 (S210). When the thin film transistor Tk is determined to be defective during the test process, the repair process is performed by irradiating a laser beam to connect the liquid crystal capacitor CLCk to the adjacent pixels (S220).

Figure 20:
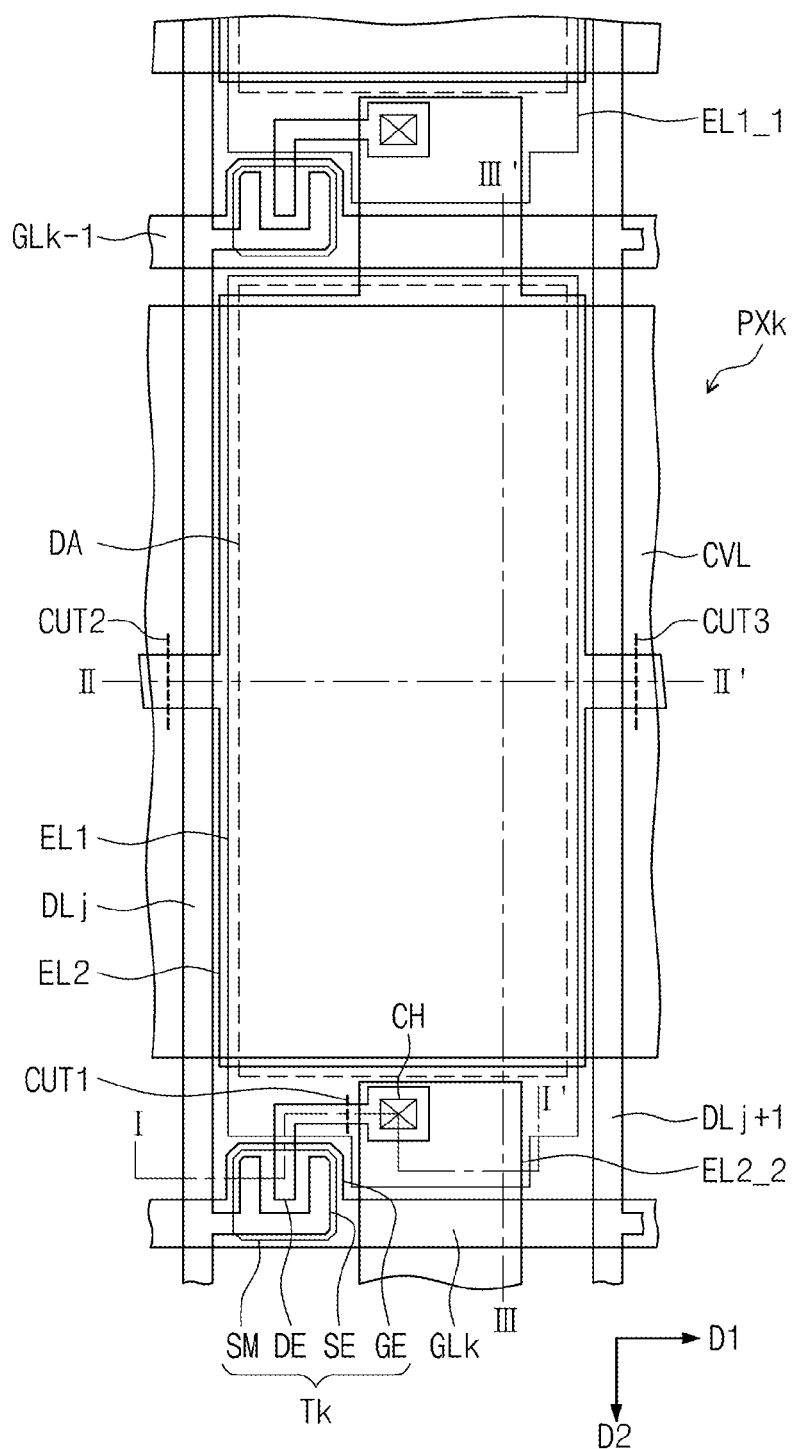
FIG. 20 is plan view showing a part of the display device when the thin film transistor is determined to be defective during the test process.

Referring to FIG. 20, when a defect in the thin film transistor Tk is detected, the first electrode EL1 of the pixel PXk is disconnected from the thin film transistor Tk (CUT1), and the first electrode EL1 of the pixel PXk is connected to the second electrode EL2_2 of the second adjacent pixel PXk+1 using the laser beam. In addition, the second electrode EL2 of the pixel PXk is disconnected from the common voltage line CVL (CUT2 and CUT3), and the second electrode EL2 of the liquid crystal capacitor CLCk is electrically connected to the first electrode EL1_1 of the liquid crystal capacitor CLCk−1 in the first adjacent pixel PXk_1 using the laser beam.

Figure 21A:
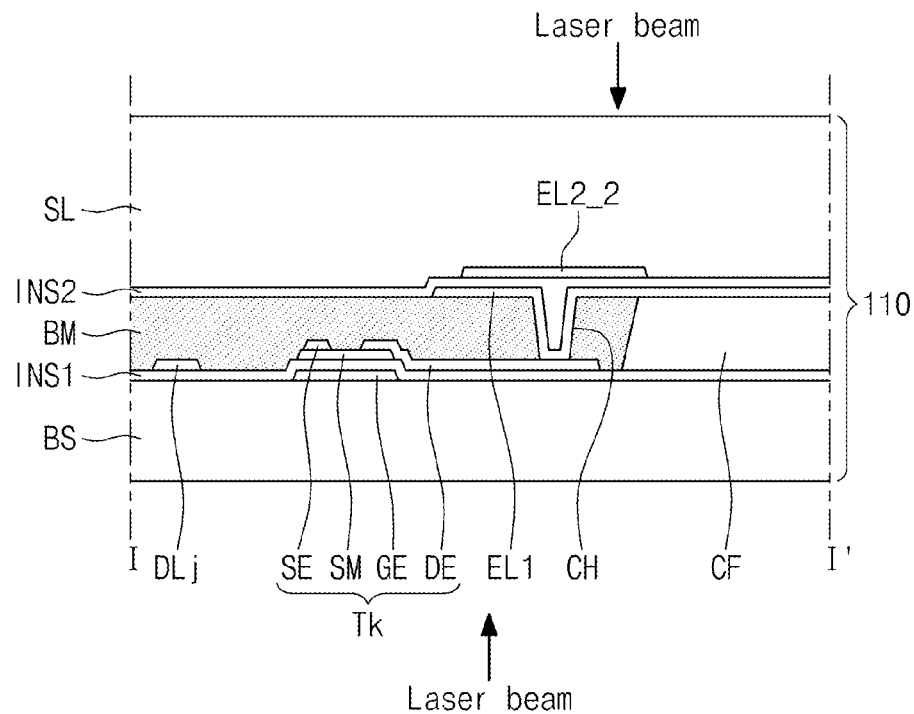
Figure 22A:
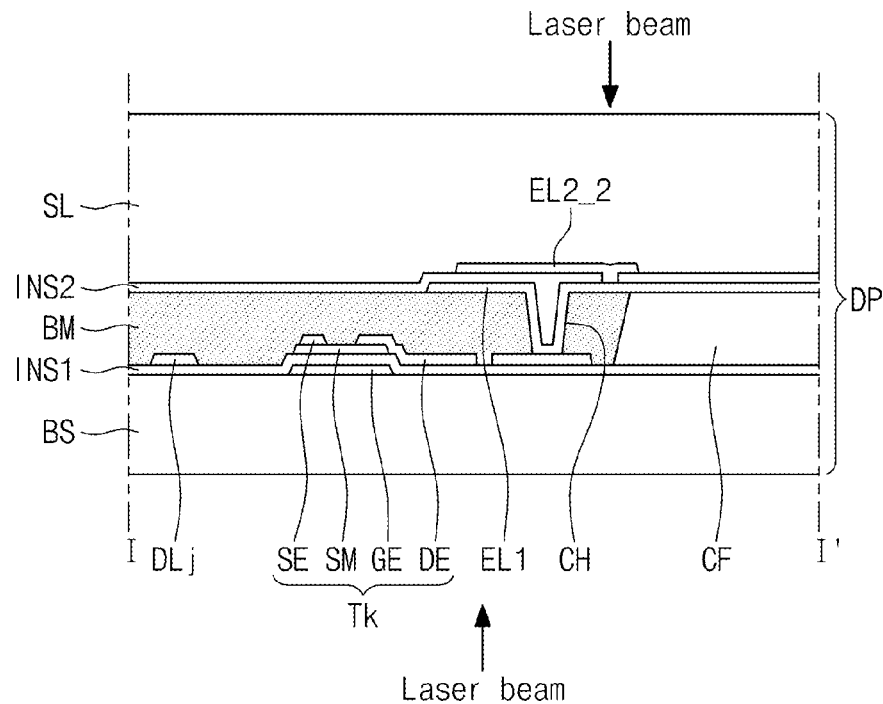

Referring to FIG. 21A, the laser beam is irradiated from the lower surface of the base substrate BS toward the first electrode EL1 in the non-display area NDA to cut the connection between the first electrode EL1 of the pixel PXk and the thin film transistor Tk. In addition, the laser beam is irradiated from an upper portion of the sealing layer SL to the area where the second electrode EL2_2 of the second adjacent pixel PXk+1 is formed, to electrically connect the first electrode EL1 of the pixel PXk to the second adjacent pixel PXk+1. That is, as shown in FIG. 22A, when the laser beam is irradiated onto the area where the second electrode EL2_2 of the second adjacent pixel PXk+1 is formed, a hole is formed through the second insulating layer INS2, and the second electrode EL2_2 melts into the hole, to thereby electrically connect the second electrode EL2_2 to the first electrode EL1 disposed thereunder.

Figure 21B:
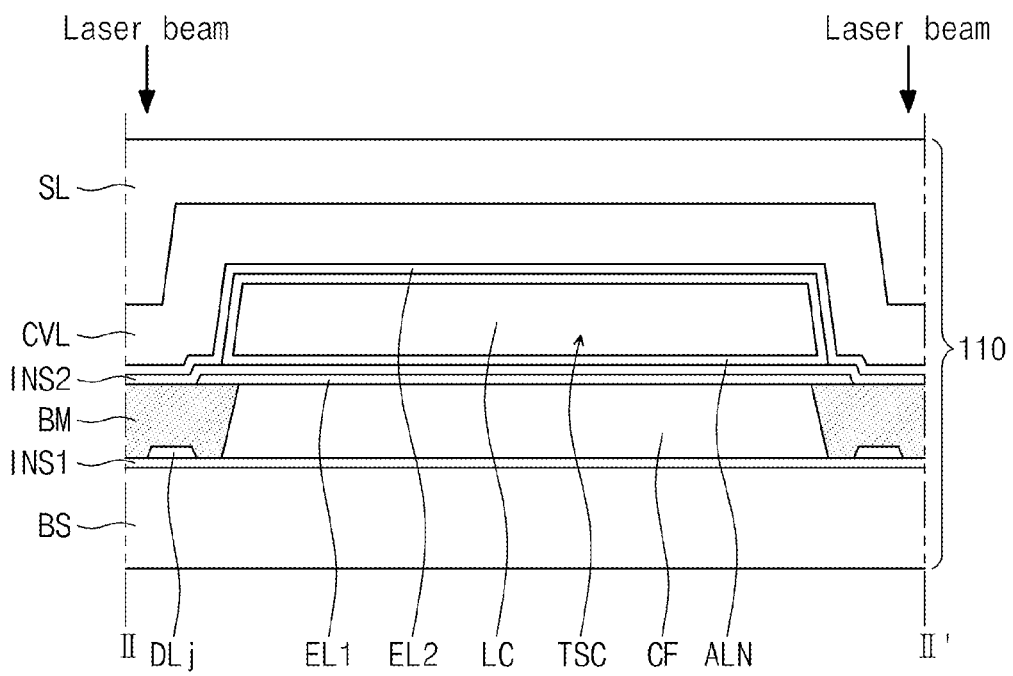
Figure 21C:
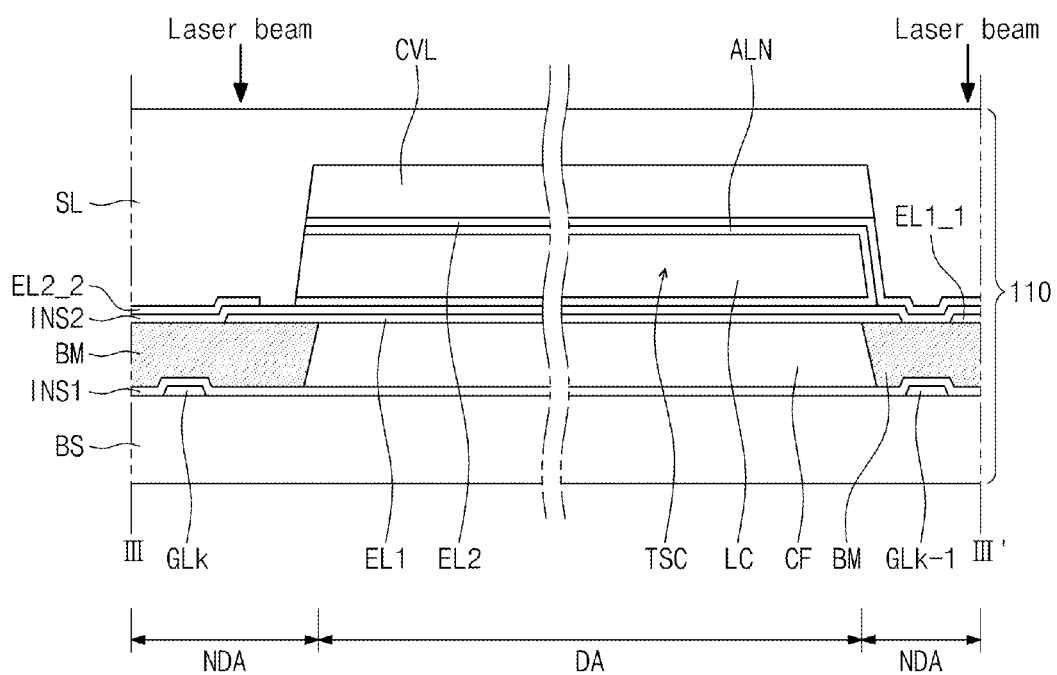
Figure 22B:
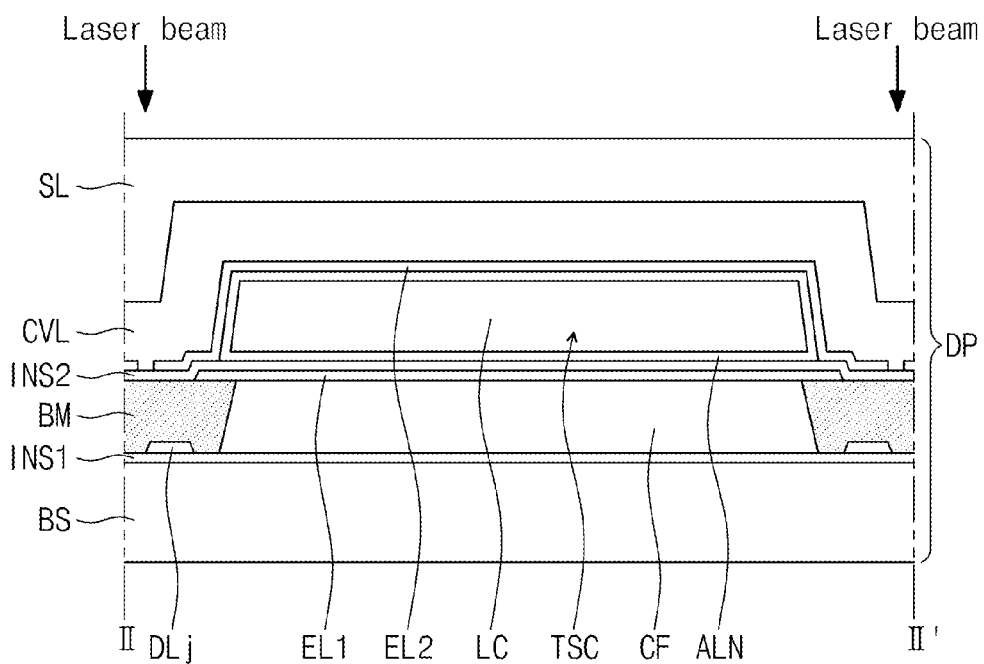

Referring to FIG. 21B, the laser beam is irradiated from the upper portion of the sealing layer SL to the area in which the second electrode EL2 is formed, to cut the connection of the second electrode EL2 of the pixel PXk in the first direction D1. That is, as shown in FIG. 22B, the laser beam is irradiated onto the area where the second electrode EL2 is formed to prevent the common voltage VCOM from being applied to the second electrode EL2.

Figure 22C:
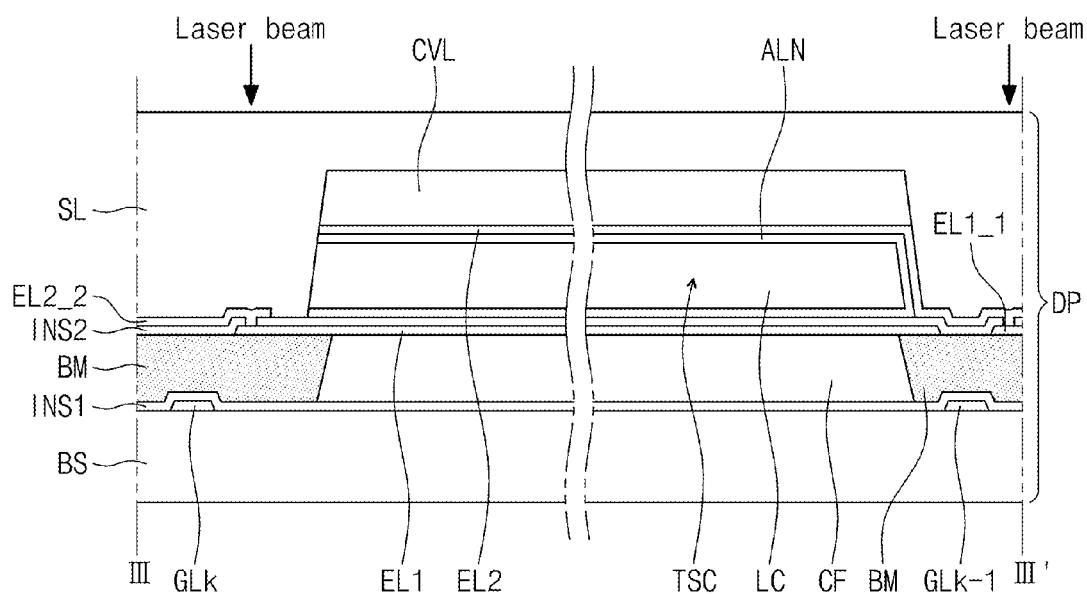

Referring to FIG. 22C, the laser beam is irradiated from the upper portion of the sealing layer SL toward the base substrate BS to electrically connect the first electrode EL1 of the pixel PXk to the second electrode EL2_2 of the second adjacent pixel PXk+1. Also, the laser beam is irradiated to electrically connect the second electrode EL2 of the pixel PXk to the first electrode EL1_1 of the first adjacent pixel PXk−1. That is, as shown in FIG. 22C, when the laser beam is irradiated onto the area where the second electrode EL2_2 of the second adjacent pixel PXk+1 is formed, a hole is formed through the second insulating layer INS2, and the second electrode EL2_2 melts and flows into the hole to be electrically connected to the first electrode EL1 disposed thereunder.

When the laser beam is irradiated onto the area where the second electrode EL2 of the first adjacent pixel PXk−1 is formed, a hole is formed through the second insulating layer INS2, and the second electrode EL2 of the pixel PXk melts and flows into the hole to be electrically connected to the first electrode EL1_1 of the first adjacent pixel PXk−1 disposed thereunder. Thus, the second electrode EL2 of the defective pixel PXk receives the same signal as the first adjacent pixel PXk−1. As a result, the defective pixel may be repaired (S220).

Figure 23A:
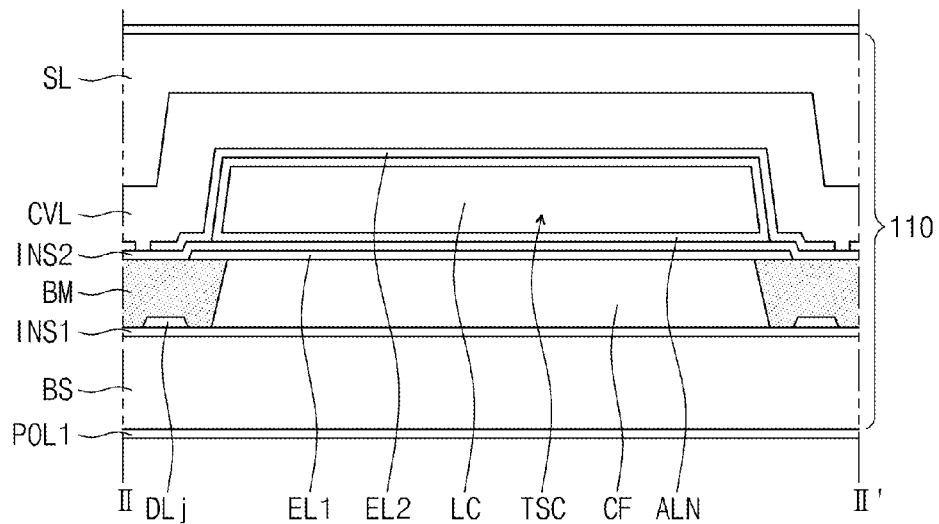
Figure 23B:
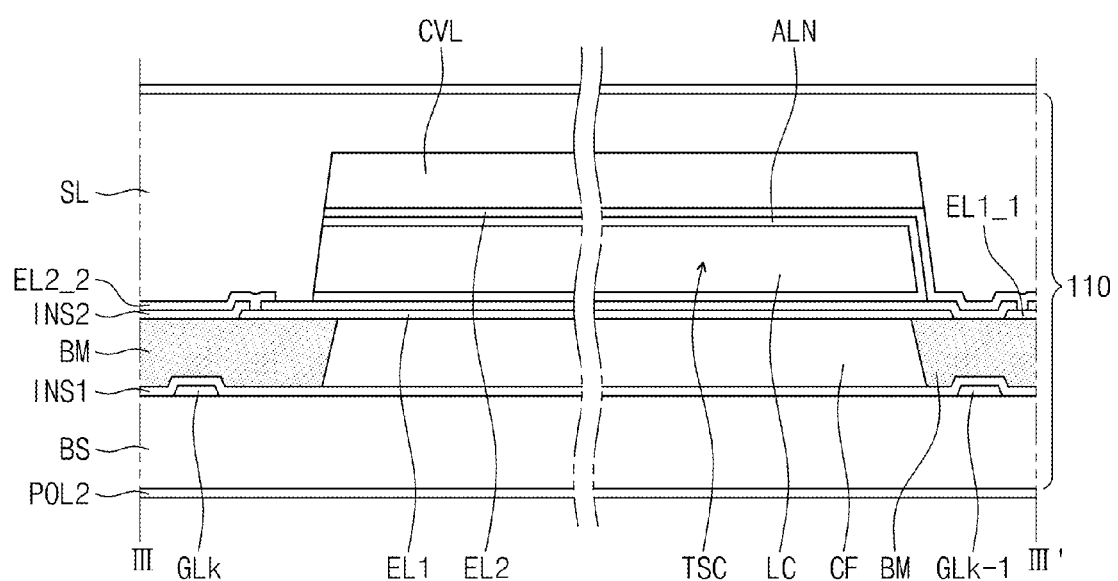

Referring to FIGS. 23A and 23B, an optical member is attached to the display panel 110 manufactured according to the above procedures (S230). The optical member includes a first polarizing substrate POL1 and a second polarizing substrate POL2.

Figure 24:
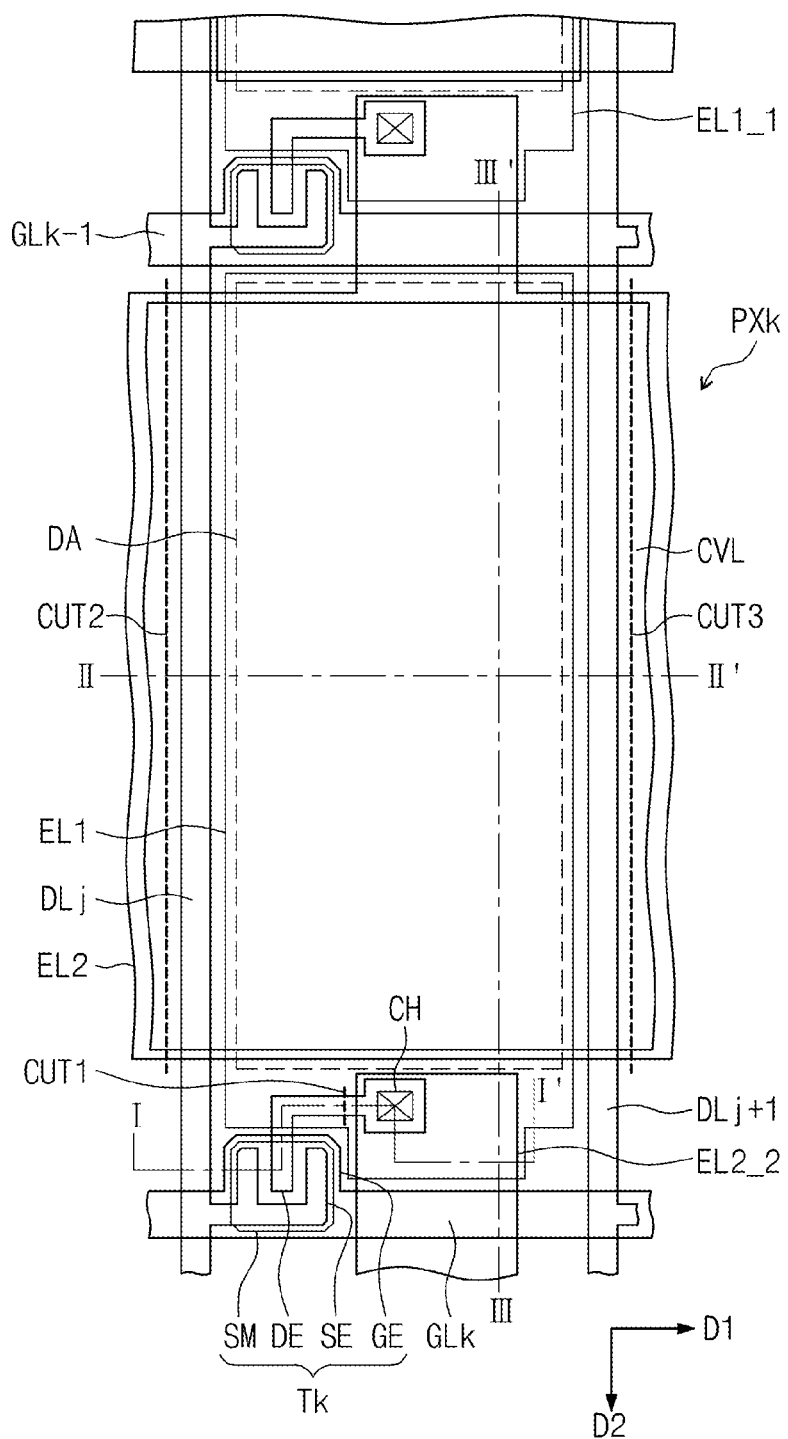
FIG. 24 is a plan view showing further details of a portion of a display device according to another exemplary embodiment of the present disclosure.

FIG. 24 is a plan view showing a portion of a display device according to another exemplary embodiment of the present disclosure.

As shown in FIG. 24, a pixel PXk of the display device is extended generally in a first direction D1. In a repair process for the display device, a second electrode EL2 extends beyond its pixel area (i.e. over the data lines DLj and DLj+1) and is cut in a second direction D2 (CUT2 and CUT3) using the laser beam, and thus the second electrode EL2 is disconnected from a common voltage line (not shown). Since the other repair processes are the same as those of shown in FIGS. 21A to 22C, detailed descriptions on the same processes will be omitted.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Various features of any of the embodiments can be combined in any manner, to form other embodiments within the spirit of the invention.

What is claimed is:

1. A display device comprising:
a substrate;
a plurality of gate lines disposed on the substrate and extended at least approximately in a first direction;
a plurality of data lines disposed on the substrate and extended at least approximately in a second direction substantially perpendicular to the first direction; and
a plurality of pixels each being connected to a corresponding gate line of the gate lines and a corresponding data line of the data lines, each of the pixels comprising:
a transistor having one end connected to one of the data lines, and a gate electrode connected to one of the gate lines;
a cover layer at least partially defining a tunnel-shaped cavity on the substrate;
a liquid crystal layer disposed in the tunnel-shaped cavity; and
a first electrode and a second electrode configured to apply an electric field to the liquid crystal layer,
wherein the first electrode of each pixel is connected to another end of its corresponding transistor, the second electrode of a predetermined one of the pixels overlaps the first electrode of a respective first adjacent pixel while being electrically insulated therefrom, and the first electrode of the predetermined one of the pixels overlaps the second electrode of a respective second adjacent pixel while being electrically insulated therefrom.

2. The display device of claim 1, wherein the first adjacent pixel, the predetermined one of the pixels, and the second adjacent pixel are sequentially arranged in the second direction.

3. The display device of claim 1, wherein, when the transistor of the predetermined one of the pixels is determined to be defective, the second electrode of the predetermined one of the pixels is configured to be electrically connected to the first electrode of the first adjacent pixel, and the first electrode of the predetermined one of the pixels is configured to be electrically connected to the second electrode of the second adjacent pixel.

4. The display device of claim 3, wherein the second electrode of each of the pixels is configured so as to be connected to a common voltage line to receive a common voltage.

5. The display device of claim 4, wherein, when the transistor of the predetermined one of the pixels is determined to be defective, the another end of the transistor of the predetermined one of the pixels is configured to be electrically disconnected from the first electrode of the predetermined pixel by a cutting operation.

6. The display device of claim 4, wherein each of the pixels comprises a display area and a non-display area, and when the transistor of the predetermined one of the pixels is determined to be defective, the second electrode of the predetermined one of the pixels is configured to be cut along the first direction in the non-display area.

7. The display device of claim 6, wherein the first electrode of the predetermined one of the pixels is configured to be electrically disconnected from the other end of the transistor of the predetermined one of the pixels by irradiating a laser beam onto a portion of the first electrode of the predetermined pixel that lies within the non-display area.

8. The display device of claim 6, wherein a length of the second electrode of each of the pixels along the second direction and in the non-display area is shorter than a length of the second electrode of each of the pixels along the second direction and in the display area.

9. The display device of claim 1, further comprising:
a cover layer at least partially defining the tunnel-shaped cavity on the substrate; and
a sealing layer sealing the tunnel-shaped cavity.

10. A method of manufacturing a display device, comprising:
forming a transistor and a first electrode in a first pixel area of a base substrate;
forming a sacrificial layer on the base substrate, the sacrificial layer extending in a first direction;
forming a second electrode in the first pixel area and on the sacrificial layer;
etching the sacrificial layer to form a tunnel-shaped cavity between the first electrode and the second electrode;
forming an image display part in the tunnel-shaped cavity; and
forming a sealing layer to seal the tunnel-shaped cavity;
wherein the second electrode overlaps another first electrode formed in a second pixel area adjacent to the first pixel area while being electrically insulated therefrom, and the first electrode of the first pixel area overlaps another second electrode formed in a third pixel area adjacent to the first pixel area while being electrically insulated therefrom.

11. The method of claim 10, further comprising testing the transistor, wherein the testing the transistor further comprises repairing the transistor by electrically connecting the second electrode of the first pixel area to the first electrode of the second pixel area, and electrically connecting the first electrode of the first pixel area to the second electrode of the third pixel area when the transistor is determined to be defective.

12. The method of claim 10, wherein the first, second, and third pixel areas are sequentially arranged along a second direction.

13. The method of claim 12, wherein each of the pixel areas has one of the second electrodes, the second electrode of each of the pixel areas extending substantially in the first direction to be connected to a common voltage line.

14. The method of claim 12, wherein the repairing the defective transistor comprises electrically disconnecting an end of the transistor from the first electrode of the first pixel area when the transistor is determined to be defective.

* * * * *